United States Patent [19]
Robinson et al.

[11] Patent Number: 5,961,877
[45] Date of Patent: Oct. 5, 1999

[54] WET CHEMICAL ETCHANTS

[76] Inventors: McDonald Robinson, 5880 Hidden La., Goleta, Calif. 93117; Richard C. Westhoff, 2559 N. Tamarisk St., Chandler, Ariz. 85224; Charles E. Hunt, 1224 Fordham Dr., Davis, Calif. 95616; Li Ling, c/o Intel Corp., MS D1-50, 5200 NE. Elam Young Pkwy., Hillsboro, Oreg. 97124-6497

[21] Appl. No.: 08/568,112

[22] Filed: Dec. 6, 1995

Related U.S. Application Data

[63] Continuation of application No. 08/336,949, Nov. 10, 1994.

[51] Int. Cl.$^6$ .................................................. C09K 13/00
[52] U.S. Cl. .......................................... 252/79.2; 252/79.3
[58] Field of Search ................................. 252/79.2, 79.3

[56] References Cited

U.S. PATENT DOCUMENTS

| | | | |
|---|---|---|---|
| 4,370,510 | 1/1983 | Stirn | 136/262 |
| 4,681,657 | 7/1987 | Hwang et al. | 252/79.3 |
| 4,885,614 | 12/1989 | Furukawa et al. | 357/16 |
| 5,344,524 | 9/1994 | Sharma et al. | 156/630 |
| 5,357,899 | 10/1994 | Bassous et al. | 117/4 |
| 5,374,842 | 12/1994 | Kusakabe | 257/487 |
| 5,413,679 | 5/1995 | Godbey | 216/99 |

FOREIGN PATENT DOCUMENTS

| | | |
|---|---|---|
| 58-154850 | 9/1983 | Japan . |
| 58-180072 | 10/1983 | Japan . |
| 61-228455 | 10/1986 | Japan . |
| 63-81490 | 4/1988 | Japan . |
| 63-82426 | 4/1988 | Japan . |
| 63-82427 | 4/1988 | Japan . |
| 63-135954 | 6/1988 | Japan . |
| 64-772 | 1/1989 | Japan . |
| 5-167091 | 12/1991 | Japan . |

OTHER PUBLICATIONS

W.E. Beadle, J.C.C. Tsai, and R.D. Plummer, *Quick Reference Manual for Silicon Integrated Circuit Technology*, John Wiley and Sons, 1985 ch. 5 pp. 5–1–5–15.

B. Schwartz and H. Robbins, *Chemical Etching of Silicon*, J. Electrochem. Soc.: Solid State Science and Technology, Dec. 1997.

Grishin, A.N. et al. "Optimizing the chemical etchng regime for silicon in nitric acid–hydrofluoric acid–acetic acid solutions" Zavodskaya Laboratoriya. 42(3) p. 331, 1976.

*Primary Examiner*—Bruce Breneman
*Assistant Examiner*—Anita Alanko
*Attorney, Agent, or Firm*—Robert Moll; @ Patent Planet

[57] ABSTRACT

Silicon-germanium-based compositions comprising silicon, germanium, and carbon (i.e., Si—Ge—C), methods for growing Si—Ge—C epitaxial layer(s) on a substrate, etchants especially suitable for Si—Ge—C etch-stops, and novel methods of use for Si—Ge—C compositions are provided. In particular, the invention relates to Si—Ge—C compositions, especially for use as etch-stops and related processes and etchants useful for microelectronic and nanotechnology fabrication.

7 Claims, 16 Drawing Sheets

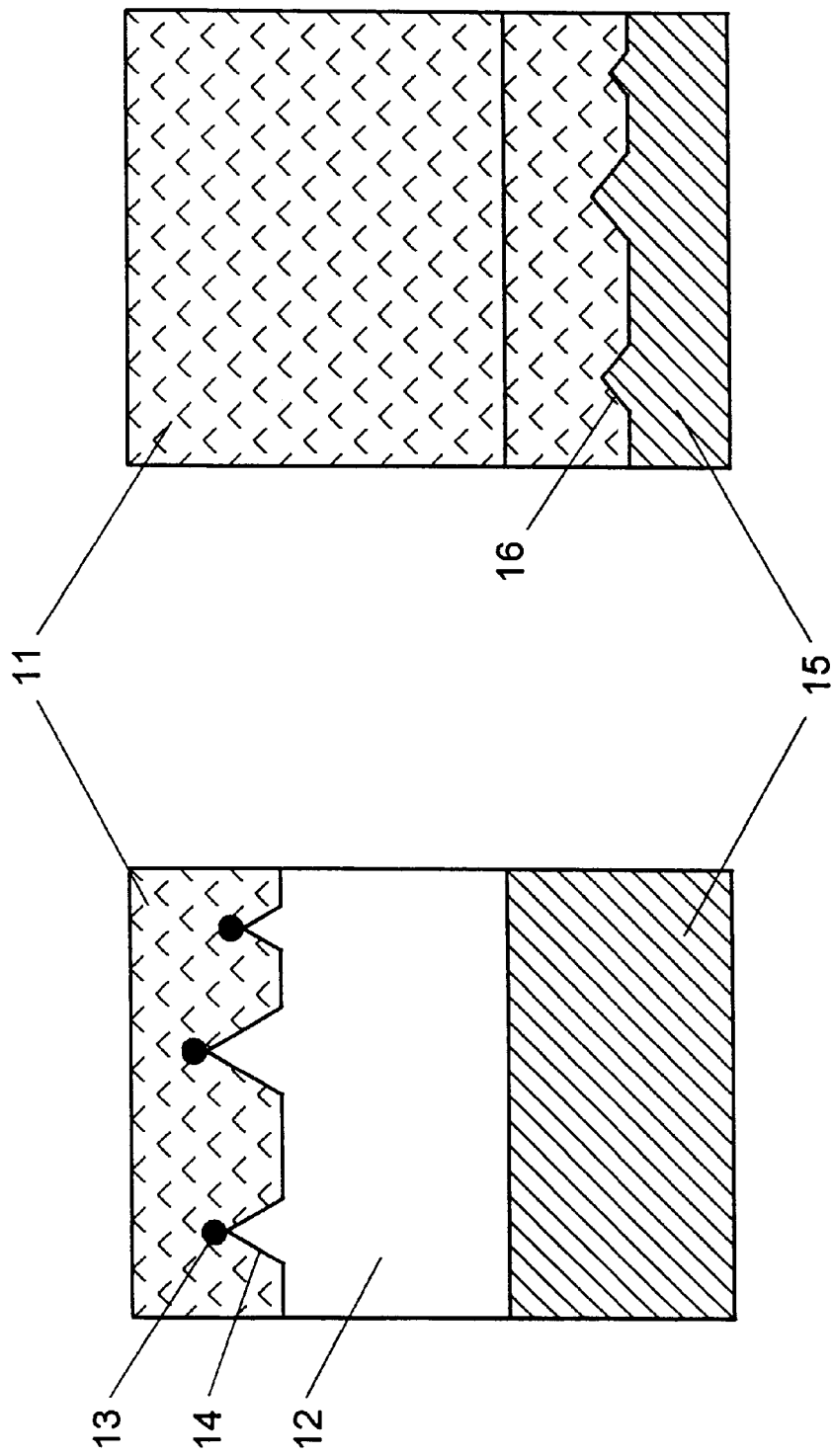

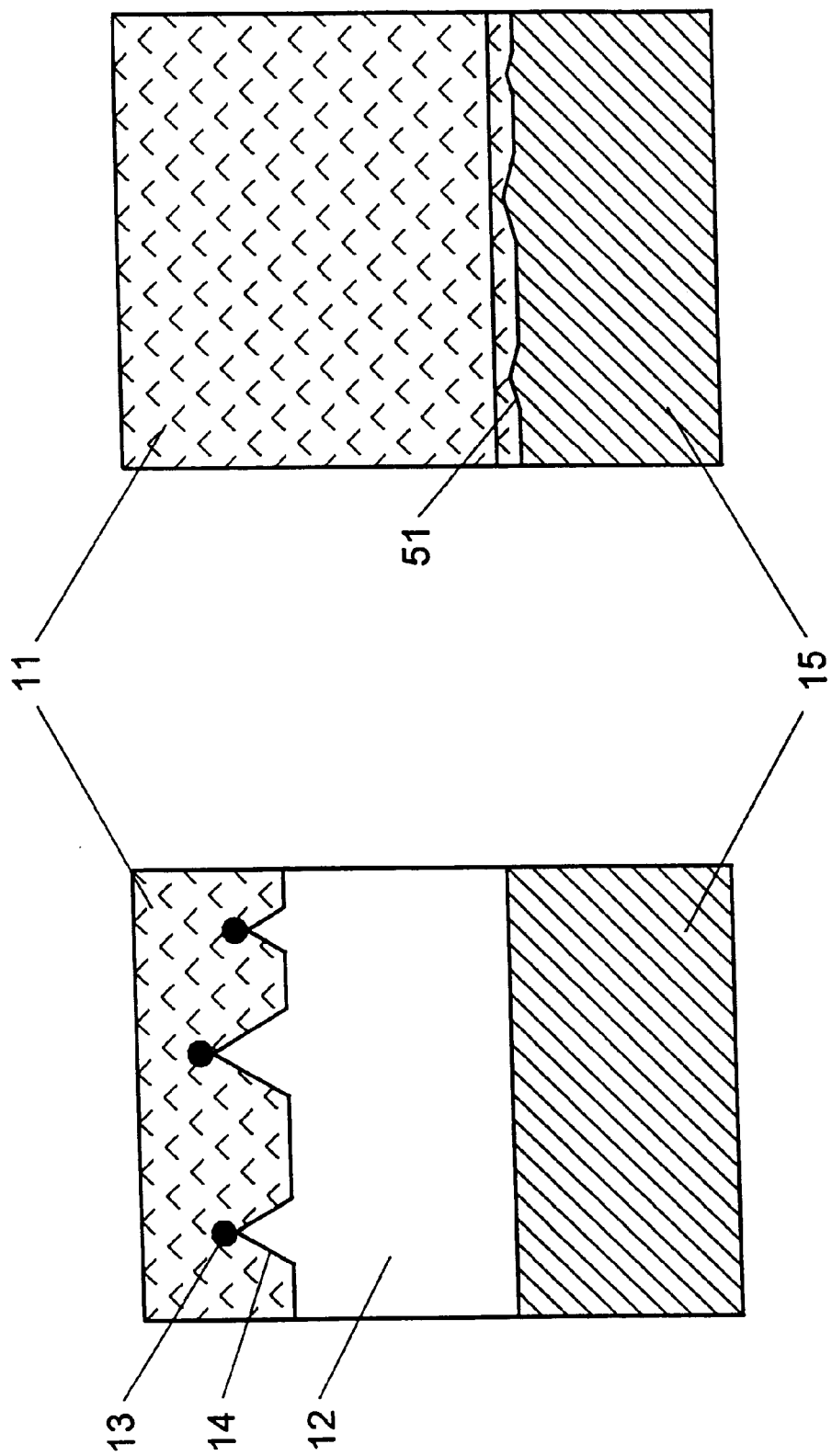

- Silicon
- ◯ Germanium
- ○ Carbon

WET CHEMICAL ETCHANTS

This application is a continuation of copending application Ser. No. 08/336,949, filed Nov. 10, 1994.

The invention was made with U.S. Government support under (i) Phase I SBIR N00014-93-C-0114 awarded by the Office of Naval Research (BMDO), (ii) F49620-93-C-0018 awarded by AFOSR (DARPA), and (iii) DMR-9115680 awarded by the National Science Foundation, and the Government has certain rights in the invention.

BACKGROUND

The present invention relates to silicon-germanium-based compositions comprising silicon, germanium and carbon (Si—Ge—C), methods for growing Si—Ge—C epitaxial layer(s) on a substrate, etchants especially suitable for Si—Ge—C etch-stops, and novel methods of use for Si—Ge—C compositions. In particular, the present invention relates to Si—Ge—C compositions, especially for use as etch-stops, related processes and etchants useful for microelectronic and nanotechnology fabrication. The present application is a continuation of, claims priority to and incorporates by reference the entire disclosure of U.S. application Ser. No. 08/336,949, filed on Nov. 10, 1994.

In etching we remove a film or layer from a substrate, in some instances defining the layer to be removed by photolithography. One way to etch is to immerse the substrate in a bath of some chemical that attacks the film. Preferably, the chemical should react with and etch the film or layer in a smooth and reproducible manner, producing soluble products that can be carried away from the substrate. In particular, an ideal etchant will not attack any layer underneath the film being etched, so that the etch process will be self-limiting. Unfortunately, the etching is often not self-limiting and therefore goes below the desired depth. Etch-stops are designed to address this problem.

Semiconductors have the interesting property that when they are alloyed with certain elements, the rate of wet chemical etch in the alloy will vary from that of the unalloyed semiconductor. Alloys with different etch rates can be used to cause etching to slow at a pre-defined interface. Typically, a layer with a particular composition etches at a known rate in an etchant A second adjacent layer may etch at a different rate because it has a different composition. The layer with the lower etch rate is often referred to as the etch-stop layer.

Etch-stops are used to fabricate devices for a wide variety of applications. Membranes and diaphragms formed via etch-stops are used in sensors such as pressure transducers, as elements in experimental x-ray lithography systems, as windows for high energy radiation, and as low thermal mass supports for microcalorimeter and bolometric radiation detectors. Additional uses for selective etch-stops are in micromachining applications such as accelerometers, gears, micro-beams, miniature fluid lines, pumps and valves, and in flow sensors. Another application with a potentially large commercial market is in fabricating silicon-on-insulator (SOI) substrates by the bond-and-etch-back silicon-on-insulator (BESOI) process.

Silicon-based selective chemical etch-stop layers such as Si—B, Si—Ge, Si—Ge—B, Si—P, and Si—As have major problems and disadvantages which are overcome by the present invention. The disadvantages can be illustrated by examining examples pertaining to the commonly used Si—Ge—B etch-stops. First, the specially doped layer (e.g., Si—Ge—B) and the lightly doped silicon have limited selectivity. Selectivity is defined as the etch rate of lightly doped silicon divided by the etch rate of the etch-stop layer, or in some cases its reciprocal as discussed below. Limited selectivity increases the manufacturing cost by creating a need for tightly controlled, and sometimes labor-intensive processing to prevent the etch from going beyond the intended depth. This problem is exacerbated when fabricating the thin layers that are required for submicron electronic devices.

Certain chemical solutions etch a lightly doped silicon layer more rapidly than a heavily doped layer. For this purpose lightly doped means less than approximately 1E17 dopant atoms per $cm^3$, and heavily doped means more than approximately 1E19 dopant atoms per $cm^3$. For example, 21 weight percent (wt %) potassium hydroxide in $H_2O$ (KOH-$H_2O$) at about 70° C. etches the (100) plane of lightly doped silicon rapidly (approximately 1 micrometer per minute), but the etch rate becomes slow (less than 0.01 micrometer per minute), making possible selective etching, as the boron concentration in the silicon increases to more than about 5E19 atoms per $cm^3$.

The conventional formulations of these etchants have serious problems when used with the above-mentioned etch-stop layers. For example, KOH-$H_2O$, an inexpensive etchant, is prone to producing a rough surface when it etches silicon. Ethylenediamine pyrocatechol in water (EDP-$H_2O$) provides somewhat better etch selectivity and is less prone to developing surface roughness than KOH-$H_2O$, but has limited application in that it emits extremely toxic vapors and is relatively expensive. Another etchant, cesium hydroxide in water (CsOH-$H_2O$), can provide smoother surfaces than KOH-$H_2O$ for conventional etch-stop layers but is even more expensive than EDP-$H_2O$.

Surface roughness arises from the anisotropic etch properties of the solutions that preferentially etch lightly doped silicon. These solutions etch certain crystallographic directions in the material faster than other directions. For example, a chemical solution consisting of 21 wt % KOH-$H_2O$ at 70° C. will rapidly etch the (100) plane of lightly doped silicon, but only slowly etch the (111) plane. This leads to the etched surface being rough as illustrated in FIGS. 1A–B. As shown in FIG. 1A, a solution of KOH-$H_2O$ (11) will rapidly etch lightly doped silicon (12). If a small particle such as particle (13) adheres to the surface of the lightly doped silicon (12), the etch rate will be locally retarded under the particle (13). Slow etching planes (14) on the (111) plane will form as the particle (13) is undercut by the etch solution. This leads to the formation of a slow-etching pyramid under the particle (13). If the etch selectivity is not sufficiently high, these pyramids will propagate into the etch-stop layer (15), shown in FIG. 1A as peaks (16), resulting in a rough surface.

Another problem with conventional etch-stop compositions, especially those containing a high boron concentration, is they leave an insoluble staining residue on the surface of the substrate. This residue both roughens and contaminates the substrate surface. Increasing the KOH concentration of the etch solution, for example, from 21 wt % to 40 wt % will eliminate the surface staining, but will also substantially decrease the etch selectivity.

In contrast to the above etchants, conventional formulations of 1:3:8 and 1:3:12 parts by volume of HF-$HNO_3$-$CH_3COOH$ (HNA) etch lightly doped silicon somewhat less rapidly than heavily doped silicon and are therefore used preferentially to remove etch-stop layers. In this case, selectivity is defined as the etch rate of the etch-stop layer divided by the etch rate of the lightly doped silicon. The above formulations of HNA have major drawbacks, including relatively low selectivity, and selectivity decreasing rapidly with time during etching due to reduction of the $HNO_3$ to $HNO_2$.

Still another problem with conventional etch-stop compositions is that the impurity which provides the etch selectivity is also a donor or acceptor dopant in the silicon. Thus, for example, when a Si—Ge—B etch-stop is used to fabricate a BESOI substrate, boron diffusing out from the etch-stop layer during a bonding anneal causes unwanted electrically active dopant in the device layer. This problem is illustrated in FIGS. 2A–B which show concentration profiles of boron and germanium as a function of depth in a substrate layer, an etch-stop layer, and a device layer, before a bonding anneal (FIG. 2A) and after the anneal (FIG. 2B). FIG. 2A illustrates the boron (21) and germanium (22) concentration profiles in the substrate (23), the etch-stop layer (24), and in the device layer (25) after epitaxial layer growth and before the bonding anneal. FIG. 2B shows the changed boron (26) and germanium (27) concentration profiles after the bonding anneal. Because boron diffuses through the material faster than germanium during the bonding anneal, its profile is broadened such that significant "diffusion tails" extend from the etch-stop layer into the substrate (23) and the device layer (25). In a BESOI structure, the boron diffusion tail causes an unacceptable level of electrically active dopant to exist in the device layer (25).

There are reports in the literature of Si—Ge—C layer fabrication. However, to the best of applicants' knowledge, none of the existing processes for forming Si—Ge—C are suitable for producing Si—Ge—C layers as part of a large scale manufacturing process. Feijóo et al., *Etch Stop Barriers in Silicon Produced by Ion Implantation of Electrically Non-Active Species, Journal of the Electrochemical Society* (1992) describe silicon layers implanted with silicon, germanium, and carbon at doses between 1E14 and 3E16 ions/cm$^2$ and energies between 35 and 200 keV and testing them as etch-stop barriers in an EDP-$H_2O$ based solution (p. 2309, Abstract). When ions are implanted in this range of dose and energies, the lattice structure is damaged. Feijóo states the results obtained indicate that the effectiveness of the etch-stop is influenced (i.e., improved) by both the implantation damage and the chemical interaction between the implanted ions and the defective crystal (Abstract). The resulting damage greatly restricts the number of useful commercial applications for Feijóo's etch-stop barriers. Accordingly, Feijóo's methods and results are substantially different from the present invention.

U.S. Pat. No. 4,885,614 to Furukawa et al., *Semiconductor Device with Crystalline Silicon-Germanium-Carbon Alloy*, describes another process of producing a silicon-germanium-carbon alloy film principally by molecular beam epitaxy, but also by plasma enhanced chemical vapor deposition (CVD), photoenhanced CVD, microwave-excited CVD, thermal CVD and metal-organic CVD methods. Molecular beam epitaxy (MBE) might provide good crystalline quality, but it is a slow and expensive process. With regard to a description of the thermal CVD process (col. 10, lines 37–43) Furukawa describes that the surface of a silicon substrate was cleaned and the temperature thereof adjusted to 650° C. Gaseous $SiH_4$, $GeH_4$ and $CH_4$ were allegedly introduced into a reactor so as to give a total pressure of 100 torr. Thus, a Si—Ge—C alloy film was purportedly formed on the substrate by a thermal CVD method. However, applicants believe methane at the stated process temperature is far too stable to function as a carbon source for thermal CVD formation of the silicon-germanium-carbon film. Further, Furukawa et al. do not recognize or discuss the use of Si—Ge—C as an etch-stop.

Regolini et al., *Growth and characterization of strain compensated $Si_{1-x-y}Ge_xC_y$ epitaxial layers, Materials Letters* (1993) describe metal-organic chemical vapor deposition (MOCVD) for fabricating epitaxial Si—Ge—C layers with less than 1 atomic percent carbon, which is far less than desirable for etch-stops. Further, there is no mention in the Regolini et al. publication of using Si—Ge—C as an etch-stop.

SUMMARY OF INVENTION

This invention describes a silicon-based etch-stop which is composed of an alloy containing silicon, germanium and carbon (Si—Ge—C). In one embodiment, this alloy demonstrates etch selectivity of 8000 to 1 compared with lightly doped silicon. High etch selectivity is demonstrated for both the case in which the Si—Ge—C epitaxial layer acts as the etch-stop, and for the opposite case in which the Si—Ge—C layer is preferentially removed.

This invention further describes a method by which the etch-stop layer is grown epitaxially and with excellent crystal quality by CVD onto a silicon substrate. One or more high quality, undoped or deliberately doped epitaxial silicon-based layers can be grown before and/or after the etch-stop layer.

This invention further describes an innovative range of etch solution compositions which, combined with the unique composition of the etch-stop layer, enhance the selectivity for removal of the etch-stop layer by more than two orders of magnitude over previous processes for etch-stop layer removal, and compared with previous formulations, provide an etch rate which varies far less with time. Further advantages will be apparent from the following description of the preferred embodiments.

BRIEF DESCRIPTION OF THE DRAWINGS

FIGS. 1A–B are cross-sections illustrating surface roughness of conventional etch-stop layers.

FIGS. 5A–B are cross-sections illustrating reduced surface roughness with a Si—Ge—C etch-stop layer.

DETAILED DESCRIPTION OF THE PREFERRED EMBODIMENTS

Figure 3:
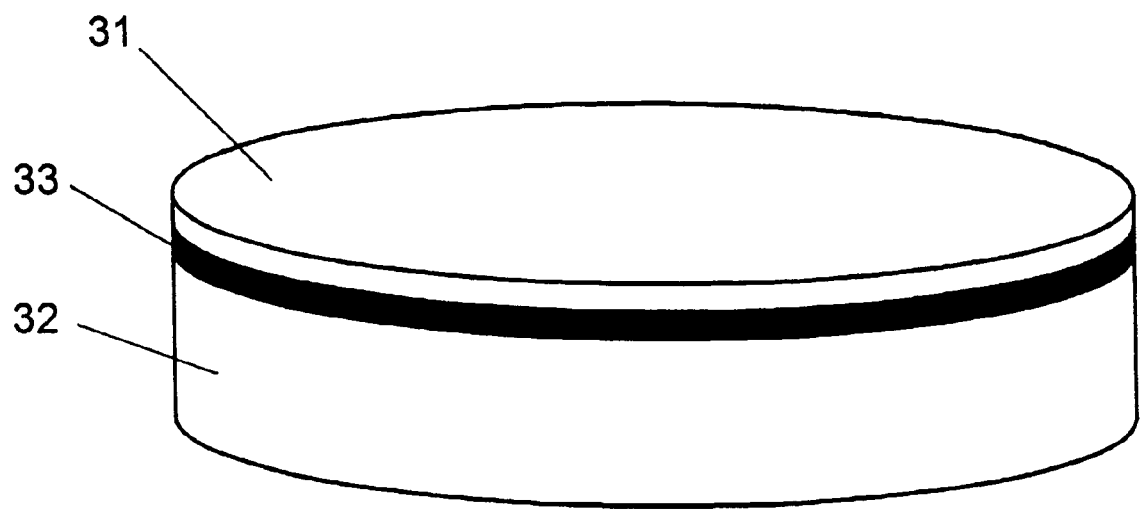
FIG. 3 is a perspective view illustrating a SOI substrate.

Example: BESOI Fabrication:

One important application of the present invention is in fabricating BESOI substrates. BESOI is used for advanced integrated circuit applications in which the device semiconductor layer (31) shown in FIG. 3 is isolated from the base wafer (32) by an insulating layer (33). The following description illustrates advantages of the invention.

Figure 4A:
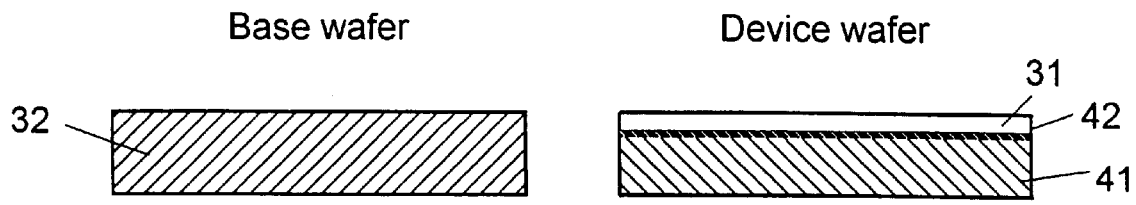
FIGS. 4A–F are cross-sections illustrating a BESOI process using an etch-stop layer.

An embodiment of a BESOI process is illustrated in FIGS. 4A–F. As shown in FIG. 4A, BESOI fabrication starts with two substrates, a base wafer (32) of a silicon wafer which can be either a lightly or heavily doped silicon wafer doped with either P-type or N-type dopant, such as boron or phosphorous, and a device wafer (41) of lightly doped silicon wafer of either of the same P-type or N-type dopants, and preferably a P-type dopant, such as boron. A Si—Ge—C layer (42) is grown epitaxially onto the device wafer (41), and a device epitaxial silicon layer (31) is grown epitaxially onto the Si—Ge—C layer. The Si—Ge—C layer (42) is 50–500 nm thick, is preferably 75–200 nm thick, and is most preferably about 100 nm thick. The Si—Ge—C layer (42) includes 2–6 atomic percent carbon, preferably 4–5 atomic percent carbon, and most preferably about 4.5 atomic percent carbon, and includes 18–65 atomic percent germanium, preferably 35–50 atomic percent germanium, and most preferably about 40 atomic percent germanium. The device silicon epitaxial layer (31) is 500–2000 nm thick, is preferably 100–150 nm thick, and is most preferably about 120 nm thick, and contains electrically active dopant of the P-type or N-type in the range of 1E13–1E19 atoms per $cm^3$, preferably 1E14–1E18 atoms per $cm^3$, and most preferably about 1E15 atoms per $cm^3$.

Figure 4B:
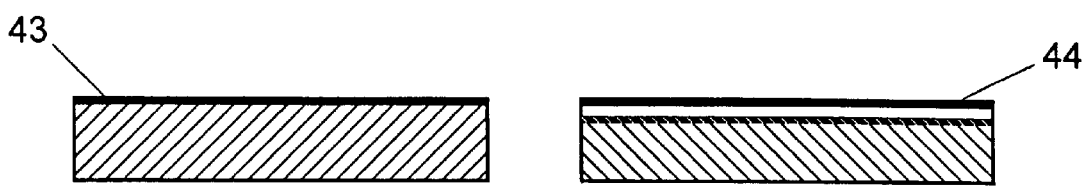

In the next step, thermal oxide layers (43, 44) shown in FIG. 4B are grown by a conventional technique such as exposing the surface of either one or preferably both of the wafers (32, 41) to water vapor at 800–1000° C. for about 5–300 minutes. W. S. Ruska, *Microelectronic Processing* (1987) describes such conventional techniques and is hereby incorporated by reference in its entirety. The base wafer oxide layer (43) thickness is 50–1000 nm, preferably 100–500 nm, and most preferably about 200–300 nm. The device wafer oxide (44) thickness is 20–100 nm, preferably 40–70 nm, and most preferably about 50–60 nm. The oxide layer thickness is preferably less on the device wafer (41) than on the base wafer (32) so that the thermal oxidation step will not diffuse or precipitate the carbon out of the Si—Ge—C layer.

Figure 4C:
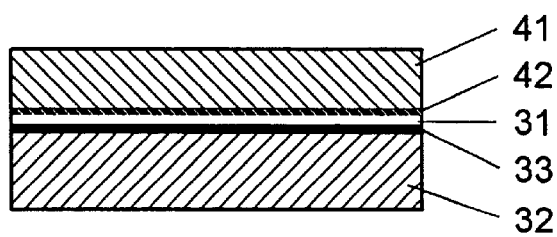

The next step is to invert the device wafer (41) and to bond it to the base wafer (32) by contacting the respective oxide surfaces (44, 43) firmly together to form an oxide layer (33) as shown in FIG. 4C.

Figure 4D:
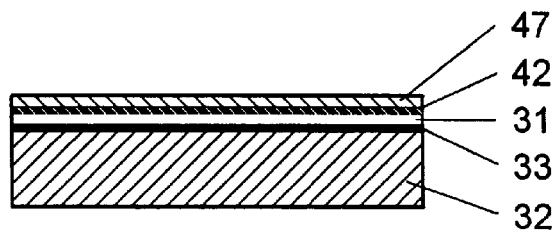

FIG. 4D illustrates that in the next step most of the device wafer (41) is removed by lapping or grinding, and optionally polished by a conventional technique to form a sacrificial silicon layer (47). The thinning is preferably stopped when approximately 10 to 50 micrometers of the sacrificial layer (47) remains over the etch-stop layer (42).

Figure 4E:
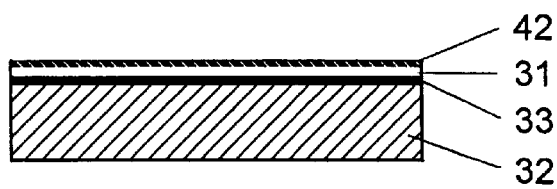

FIG. 4E illustrates the structure after the first selective etch step in which the final 10 to 50 micrometers of the sacrificial layer (47) (shown in FIG. 4D) is removed using a chemical solution such as 10 to 45 wt % and preferably 21 wt % $KOH-H_2O$, and in a temperature range of from 50 to 100° C., and preferably at about 70° C., which will etch the sacrificial layer (47) (shown in FIG. 4D), but will substantially stop etching when it reaches the etch-stop layer (42).

Figure 4F:
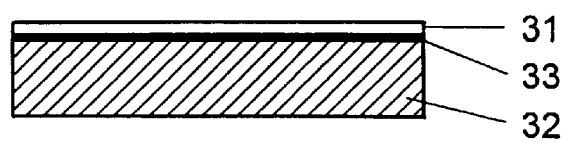

FIG. 4F illustrates the result of the final etch step in which the etch-stop layer (42) shown in FIG. 4E is removed using a chemical solution such as HNA at room temperature which etches the Si—Ge—C layer rapidly, but essentially stops etching when it reaches the lightly doped epitaxial device layer (31). The final structure, shown also in FIG. 3, is the lightly doped epitaxial device layer (31) separated from the substrate (32) by the insulating oxide (33).

FIGS. 5A–B illustrate how the present invention solves the surface roughness problem involved in BESOI processing by the conventional method shown in FIG. 1B. FIG. 5A again shows a solution of $KOH-H_2O$ (11) will rapidly etch lightly doped silicon (12). Again, if a small particle (13) adheres to the surface of the lightly doped silicon (12), the etch rate is locally retarded under the particle (13), and the slow etching planes (14) on the (111) plane form as the particle (13) is undercut by the etch solution. However, in the present invention, the resulting pyramidal defect will no longer propagate into the etch-stop layer (15) because of the improved selectivity of the etch-stop layer. As shown in FIG. 5B, the surface roughness (51) is substantially reduced when the etch front reaches the etch-stop layer (15) due to the pyramidal defects being substantially etched away before the etch front significantly proceeds into the etch-stop layer (15).

Chemical vapor deposition of an epitaxial Si—Ge—C layer on silicon:

One aspect of the present invention is that we have discovered a method to grow Si—Ge—C layers epitaxially by a commercially viable CVD method onto silicon at temperatures that are low enough to "quench" carbon into the epitaxial layer. Low temperature is important because whereas the germanium-silicon system exhibits complete solid solubility, carbon is nearly insoluble in silicon. The maximum solubility of carbon in silicon is about 1 part per million at the melting point of silicon. Thus, to incorporate several atomic percent carbon into silicon the epitaxial layer growth takes place at a low enough temperature so that the carbon atoms are essentially immobile in the silicon lattice. In practice, the growth temperature is preferably less than about 800° C. Numerous publications on the CVD growth of silicon carbide suggest that for most hydrocarbon gases a growth temperature greater than 1100° C. is required to decompose the hydrocarbon precursor gases to supply a gas source of carbon. In the present invention, we discovered that cyclopropane or ethylene can provide a source of carbon that is sufficiently reactive to deposit carbon-containing layers in a CVD process at temperatures as low as 600° C.

We have further discovered that certain novel processes significantly improve the ability to grow high quality Si—Ge—C layers. For example, the following process produces Si—Ge—C epitaxial layers with 42 atomic percent germanium, 5 atomic percent carbon, and a low defect density. A lightly doped, P-type (100) 200 mm diameter prime silicon substrate is cleaned and loaded into a CVD reactor using a robotic transfer arm. A suitable reactor for this application is an Epsilon One, Model E-2, manufactured by ASM America, Phoenix, Ariz. Initially, the reactor temperature is held in the range from 25–900° C., preferably 800–900° C., and most preferably about 850° C. Hydrogen gas is introduced into the reactor at preferably atmospheric pressure, or at reduced pressure of, for example, 5–100 torr, at a flow rate of 10–100 standard liters per minute (slm), preferably 15–40 slm, most preferably about 20 slm. Next, the substrate is heated to 1000–1200° C., preferably to 1100–1190° C., and most preferably to about 1150° C. The reactor is most preferably held at about 1150° C. for 30 to 600 seconds, preferably 60 to 300 seconds, and most preferably about 90 seconds to remove the native oxide layer from the substrate. The substrate is then cooled to 900° C. in the $H_2$ atmosphere before the deposition of silicon. At 900° C., 5 to 200 standard cubic centimeters per minute (sccm), preferably 10 to 50 sccm, and most preferably about 20 sccm of $SiH_2Cl_2$ (dichlorosilane) is introduced into the reactor atmosphere to initiate deposition of the undoped or lightly doped epitaxial silicon. Deposition continues as the substrate is cooled further, and at 700° C. a low flowrate (e.g., 0.1 sccm) of $GeH_4$ (germane) is added to the deposition atmosphere. The substrate is cooled still further, and at 550–750° C., preferably 600–700° C., and most preferably about 625° C. the low flowrate of $GeH_4$ is increased over a span of 15 seconds to a final flowrate of from 1.0 to 20.0 sccm, preferably 1.4 to 5.0 sccm, and most preferably about 1.8 sccm. Just as the $GeH_4$ flowrate reaches its final value, $C_3H_6$ (cyclopropane) is added at a low flowrate (e.g. 25 sccm) to the deposition atmosphere. The low flowrate of cyclopropane is increased over a span of 15 seconds to a final flowrate of from 50 to 200 sccm, preferably 75 to 150 sccm, and most preferably about 100 sccm. All final gas flowrates are then held constant for 1 to 100 minutes, preferably 5 to 10 minutes, and most preferably about 6.5 minutes while a Si—Ge—C layer of approximately 200 nm thickness is grown. Following deposition the reactor is purged with 20 slm of pure $H_2$ for about 45 seconds. Afterward the robotic transfer arm removes the substrate from the reactor. In an alternative embodiment, an alkene such as ethylene can be substituted for cyclopropane in a similar process.

The reasons for the above process improvements are as follows. The surface of silicon forms a tenacious silicon dioxide ($SiO_2$) when exposed to air. This oxide is removed from silicon during heating in hydrogen to a high temperature such as 1150° C., but the oxide tends to reform when the silicon surface is exposed to trace amounts of oxygen or water vapor at a lower temperature. By starting the CVD silicon growth at 900° C., and by adding a small concentration of $GeH_4$ to the gas at 700° C., we prevent trace amounts of oxygen and water vapor in the deposition atmosphere from causing oxide nuclei to form as the temperature is lowered to the level that is favorable for Si—Ge—C deposition. As this protective Si—Ge layer is deposited the $GeH_4$ concentration is held low and ramped up quickly to keep the thickness and stress of the layer well below the critical thickness for formation of misfit dislocations. The $C_3H_6$ flowrate is ramped from a low value to the final value for a totally different reason. In developing this process we discovered that the best crystalline quality is obtained by starting the Si—Ge—C deposition with a low concentration of hydrocarbon and then ramping the flowrate up until the desired carbon concentration is obtained. The reason may be related to the low solubility of carbon in silicon. Starting the Si—Ge—C deposition with a low surface concentration of carbon may be important in establishing a steady-state growth process in which carbon is incorporated in non-equilibrium concentrations into the silicon-germanium lattice.

An economical epitaxial layer growth process is important if the epitaxial single Si—Ge—C layers are to be used for commercial applications. As will be demonstrated in the examples which follow, the process which we discovered can be operated in a commercial CVD epitaxial reactor at rates sufficiently high that the Si—Ge—C layers can be produced at prices comparable to present epitaxial silicon layers. A suitable reactor for this application is again the Epsilon One, Model E-2, manufactured by ASM America, Phoenix, Ariz. The reactor can be configured for single wafer automated processing using vacuum-compatible load lock ports and a nitrogen-purged robotic wafer transfer chamber. The load lock ports and the wafer transfer chamber effectively isolate the process chamber from atmospheric contamination. Evacuation of the load lock ports is important to prevent air from entering the process chamber and to remove adsorbed moisture from the surfaces of the substrates before processing.

High purity materials are important for low-temperature, defect-free production of epitaxial Si—Ge—C layers. Hydrogen and nitrogen liquid sources having impurity levels less than 10 parts per billion (ppb) can be obtained from Air Products & Chemicals, Inc., in Allentown, Pa. Dichlorosilane gas of Ultraplus grade can be obtained from Praxair, in Kingman, Ariz.; and a 1:99 volume ratio and a 10:90 volume ratio of germane:hydrogen of Megabit grade can be obtained from Solkatronic Chemicals, in Fairfield, N.J. The 10:90 volume ratio of cyclopropane:helium of semiconductor grade can be obtained from Air Products & Chemicals. The hydrogen, nitrogen, germane and cyclopropane gases can be further purified by point-of-use Nanochem purifiers made by Semi-Gas Systems, in Santa Clara, Calif.

Additional processes and embodiments for the formation of thin heteroepitaxial films of Si—Ge—C grown on silicon substrates using CVD and $C_2H_4$ gas as a carbon source at the relatively low temperature of 625° C. are described as Chemical Vapor Deposition Of Heteroepitaxial $Si_{1-x-y}Ge_xC_y$ Films On (100)Si Substrates.

Thin heteroepitaxial films of $Si_{1-x-y}Ge_xC_y$ have been grown on (100)Si substrates using atmospheric pressure Chemical Vapor Deposition (CVD) at 625° C. The crystallinity, composition and microstructure of the Si—Ge—C films were characterized using Rutherford back-scattering spectrometry, secondary-ion-mass spectrometry and cross-sectional transmission electron microscopy. The crystallinity of the films was very sensitive to the flow rate of $C_2H_4$ which served as the C source. Films with up to 2% C were epitaxial with good crystallinity and very few interfacial defects. Between 800 and 900 sccm of 10% $C_2H_4$ in He, the C content increased dramatically from 2% to 10% and the as-grown films changed from crystalline to amorphous. In order to establish deposition conditions for the crystalline-amorphous phase transformation, one Si—Ge—C film was deposited as the 10% $C_2H_4$ flow was increased linearly from 500 to 1500 sccm during growth. When the C content reached ~4%, the film developed considerable stacking defects and disorder, and at around 11% C, the film became amorphous.

The significant successes of semiconductor electronic devices are closely connected to the concept of band gap engineering. The band gap of Si-based materials has been successfully engineered by alloying with Ge and by forming strained layer superlattices. See R. People, J. C. Bean, D. V. Lang, A. M. Sergent, H. L. Stromer, K. W. Wecht, R. T. Lynch, and K. Baldwin, Appl. Phys. Lett. 45, 1231 (1984), which is incorporated by reference in its entirety. The band gap decreases monotonically as the Ge concentration increases, although compressive strain in pseudomorphic $Si_{1-x}Ge_x$ grown epitaxially on (100)Si substrates causes stability problems and limits the film thickness. In many applications it is desirable to have a wider band gap than that of pure Si. Carbon in its diamond form is an elemental group-IV insulator (wide band gap of 5.5 eV) with a lattice parameter of 0.3545 nm, much smaller than that of Si (0.5431 nm) or Ge (0.5646 nm). Adding substitutional carbon into Si—Ge alloy layers may increase the band gap (see Richard A. Soref, J. Appl. Phys. 70, 2470 (1991), which is incorporated by reference in its entirety) and, at the same time, result in strain compensation. See S. Furukawa, H. Etoh, A. Ishizaka, and T. Shimada, U.S. Pat. No. 4,885,614, (1989), which is incorporated by reference in its entirety. See K. Eberl, S. S. Iyer, and F. K. LeGoues, Appl. Phys. Lett. 64, 739 (1994), which is incorporated by reference in its entirety. In fact, strain in $Si_{1-x-y}Ge_xC_y$ alloy layers can be adjusted over a wide range from compressive all the way to tensile, depending on the Ge/C concentration ratio. If Vegard's law is applied to the Si—Ge—C ternary system, then we expect compensation of 8.2 atomic % Ge by 1 atomic % C in the pseudomorphic $Si_{1-x-y}Ge_xC_y$ film. See S. S. Iyer, K. Eberl, M. S. Goorsky, F. K. LeGoues, J. C. Tsang, Appl. Phys. Lett. 60, 356 (1992), which is incorporated by reference in its entirety. Recently, strain compensation by sequential implantation of C in Si—Ge alloy layers has been investigated by forming $Si_{1-x-y}Ge_xC_y$ layers embedded in Si. See J. W. Strane, H. J. Stein, S. R. Doyle, S. T. Picraux, and J. W. Mayer. Appl. Phys. Lett. 63, 2786 (1993), which is incorporated by reference in its entirety. See A. Fukami, K. Shoji, T. Nagano, and C. Y. Yang, Appl. Phys. Lett. 57, 2345 (1990), which is incorporated by reference in its entirety. However, since the maximum solubility limit of C in Si is $2 \times 10^{-3}$ atomic %, precipitation of silicon carbide has been a severe problem, particularly since higher temperatures are required to grow the structure and repair implantation damage. This section is focused on the growth of pseudomorphic $Si_{1-x-y}Ge_xC_y$ layers on (100)Si substrates using Chemical Vapor Deposition (CVD).

$Si_{1-x-y}Ge_xC_y$ layers were epitaxially grown on (100)Si in an EPSILON ONE, model E-2 single wafer, automated CVD reactor using $SiH_2Cl_2$ as a Si source, $GeH_4$ as a Ge source, and $C_2H_4$ as the C source at atmospheric pressure. Point of use purifiers on the gas lines provide purity levels in the parts-per-billion range in the process chamber. Nitrogen-purged load locks exclude air from the system. Four different samples were grown at 625° C. at various $C_2H_4$ flows while the flows of the other two precursors were held constant. The growth conditions are summarized in Table 1 shown below.

Rutherford backscattering spectrometry (RBS) in the channeling mode and the $^{12}C(\alpha,\alpha)^{12}C$ elastic resonance reaction at 4.265 MeV were used to determine the composition, thickness and crystalline quality of the grown layer. The distribution of carbon within the films was characterized by secondary-ion-mass spectroscopy (SIMS), and the morphology of the grown layers was examined by cross-sectional transmission electron microscopy (TEM).

TABLE 1

Sample growth conditions in CVD system.

| Sample | Deposition Temperature (°C.) | $SiH_2Cl_2$ (sccm) | $GeH_4$ 1% in $H_2$ (sccm) | 10% $C_2H_4$ in He start (sccm) | 10% $C_2H_4$ in He end (sccm) |
|---|---|---|---|---|---|
| A-6 | 625 | 20 | 180 | 504 | 504 |
| B-6 | 625 | 20 | 180 | 800 | 800 |
| C-6 | 625 | 20 | 180 | 900 | 900 |
| D-6 | 625 | 20 | 180 | 500 | 1500 |

Figure 12A:
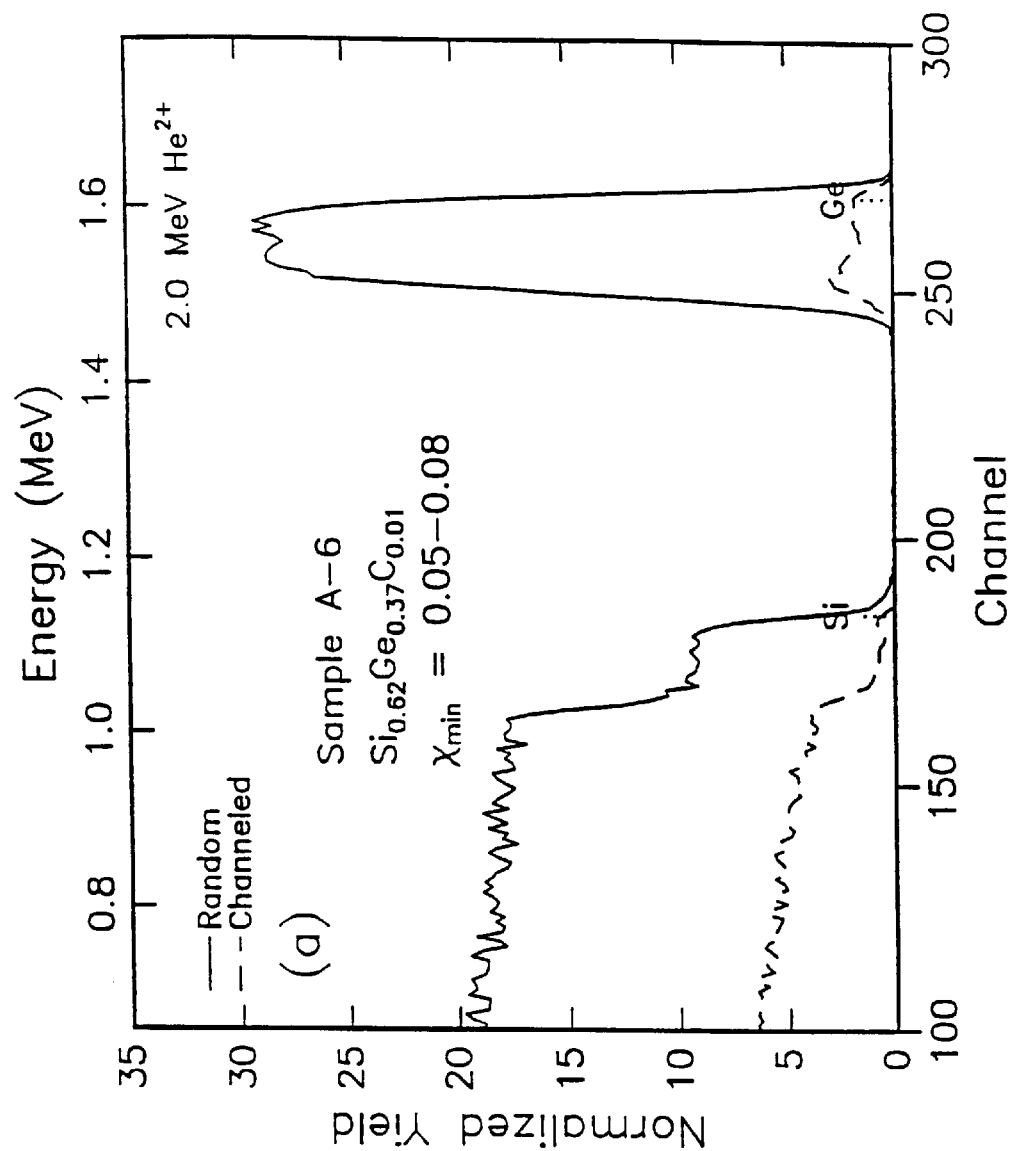
FIGS. 12A–B illustrate 2.0 MeV $He^{2+}$ RBS random and (100) channeled spectra for: (a) sample A-6; (b) sample B-6. The dechanneling observed close to the Si—Ge—C/Si interface suggested the presence of misfit dislocations.
Figure 12B:
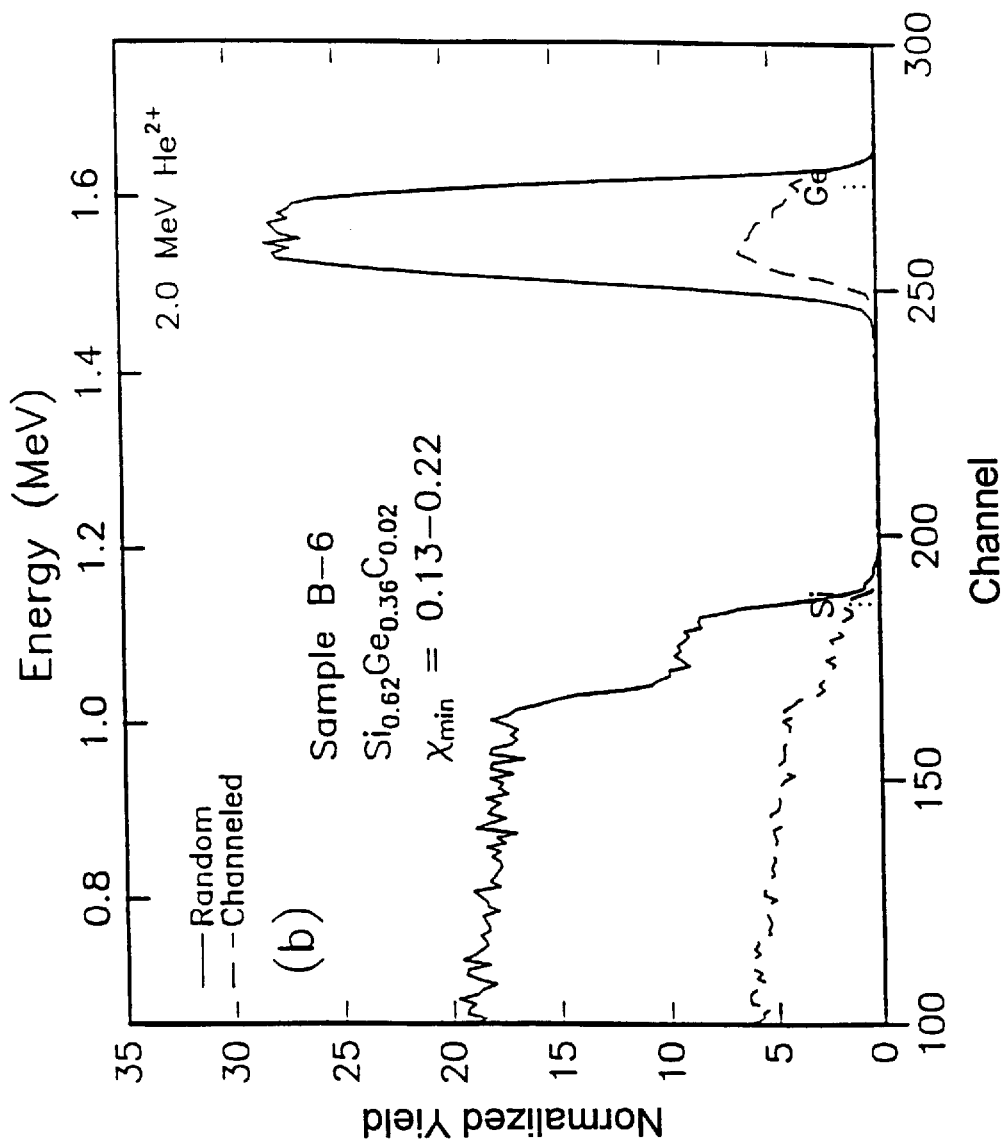

FIGS. 12(a) and (b) show the 2.0 MeV $He^{2+}$ RBS random and (100) channeled spectra for the as-grown A-6 and B-6 samples, respectively. The measured values for $\chi_{min}$ ranged from 0.05 to 0.08 for sample A-6 and 0.13 to 0.22 for sample B-6, with the higher values obtained close to the Si—Ge—C/Si interface in both samples. A significant yield enhancement was observed in the Si substrate region of the spectrum. This enhancement was caused by dechanneling, which suggested the presence of defects at the Si—Ge—C/Si interface. Complementary TEM observations indicate that the majority of these defects are simple edge dislocations. The carbon content of these samples was measured by the $^{12}C(\alpha,\alpha)^{12}C$ elastic resonance reaction using a 4.28 MeV beam of $He^{++}$ ions. It was found that the fractions of Ge and C in the $Si_{1-x-y}Ge_xC_y$ layer were x=0.37 and y=0.012 for sample A-6 and x=0.36 and y=0.02 for sample B-6. The SIMS carbon profiles for these samples showed that the carbon was distributed uniformly in the alloy layer.

Figure 13:
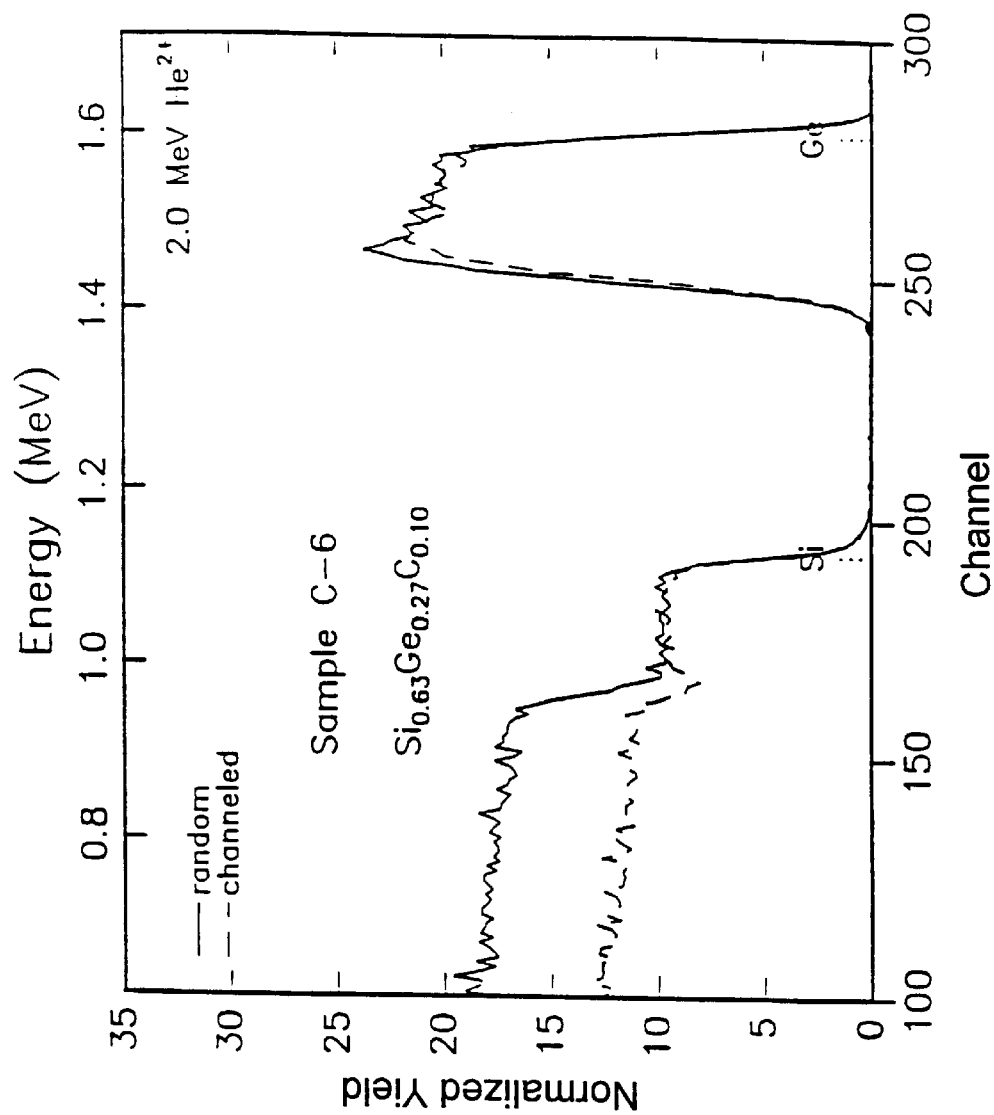
FIG. 13 illustrates 2.0 MeV $He^{2+}$ RBS random and (100) channeled spectra for: (a) sample C-6. The Si—Ge—C was not even grown epitaxially on the (100)Si substrate.

FIG. 13 shows the 2.0 MeV $He^{2+}$ RBS random and (100) channeled spectra for the as-grown sample C.6. The overlapping of the random and aligned spectra that exists in the Si—Ge—C region indicates that this layer was not grown epitaxially on the (100)Si substrate. The fraction of C in the alloy, as measured by resonance analysis, was y=0.10 while the Ge fraction was x=0.27. SIMS analysis showed that carbon was distributed uniformly in the alloy layer, and cross-sectional TEM showed that the Si—Ge—C layer was amorphous. It was observed that for a relatively small increase in the $C_2H_4$ flow (from 800 to 900 sccm) the carbon content increased dramatically and the layer went from crystalline to amorphous. Thus, under these growth conditions, it appears that there is a critical level of $C_2H_4$ flow that changes the growth from epitaxial to amorphous, while the incorporated carbon increases from 2 atomic % to 10 atomic %. Determination of this critical flow level may be very important, since this parameter affects directly the maximum concentration of carbon that can be incorporated into the single crystal Si—Ge matrix during the epitaxial growth that takes place in this CVD system.

Figure 14:
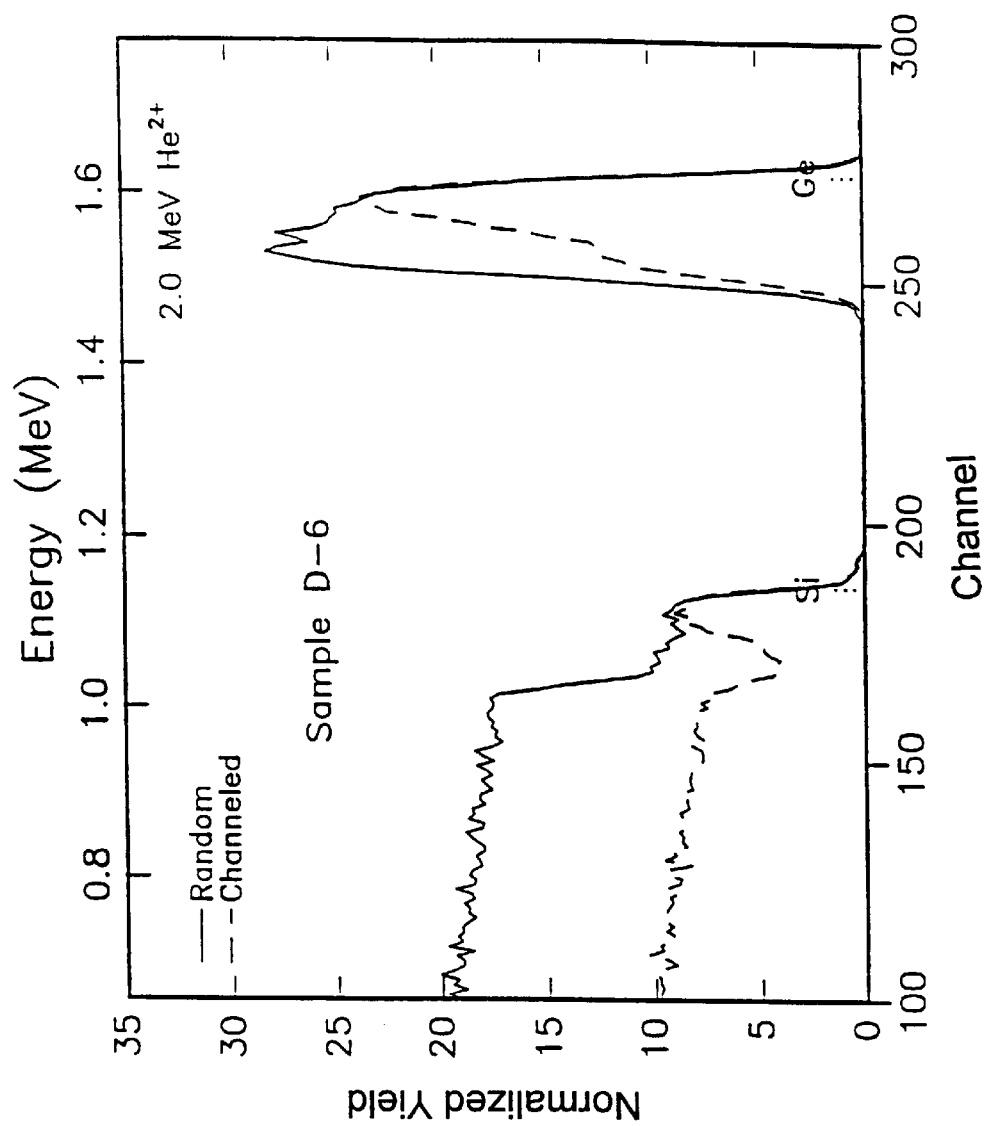
FIG. 14 illustrates 2.0 MeV $He^{2+}$ RBS random and (100) channeled spectra for sample D-6. The Si—Ge—C was initially grown epitaxially. A subsequent c-a (crystalline-to-amorphous) phase transformation occurred.

In order to investigate this critical flow level, another sample was grown (sample D-6) using the same conditions (shown in Table I), except that the $C_2H_4$ flow was increased linearly from 500 sccm at the beginning of growth to 1500 sccm at the end. FIG. 14 shows the 2.0 MeV $He^{2+}$ RBS random and (100) channeled spectra for this sample. We observe that the channeled spectrum overlaps the random spectrum for both Si and Ge signals at the region near the surface, indicating the presence of an amorphous layer, while for the region of the spectrum closer to the Si—Ge—C/Si interface, the yield of the channeled spectrum decreases sharply. These observations reveal that at the beginning of the growth process the Si—Ge—C was grown epitaxially, but that a crystalline-amorphous phase transformation occurred sometime during the growth process. The random spectrum shows that the Ge concentration decreases monotonically from the interface to the surface while the Si concentration does not change significantly.

Figure 15:
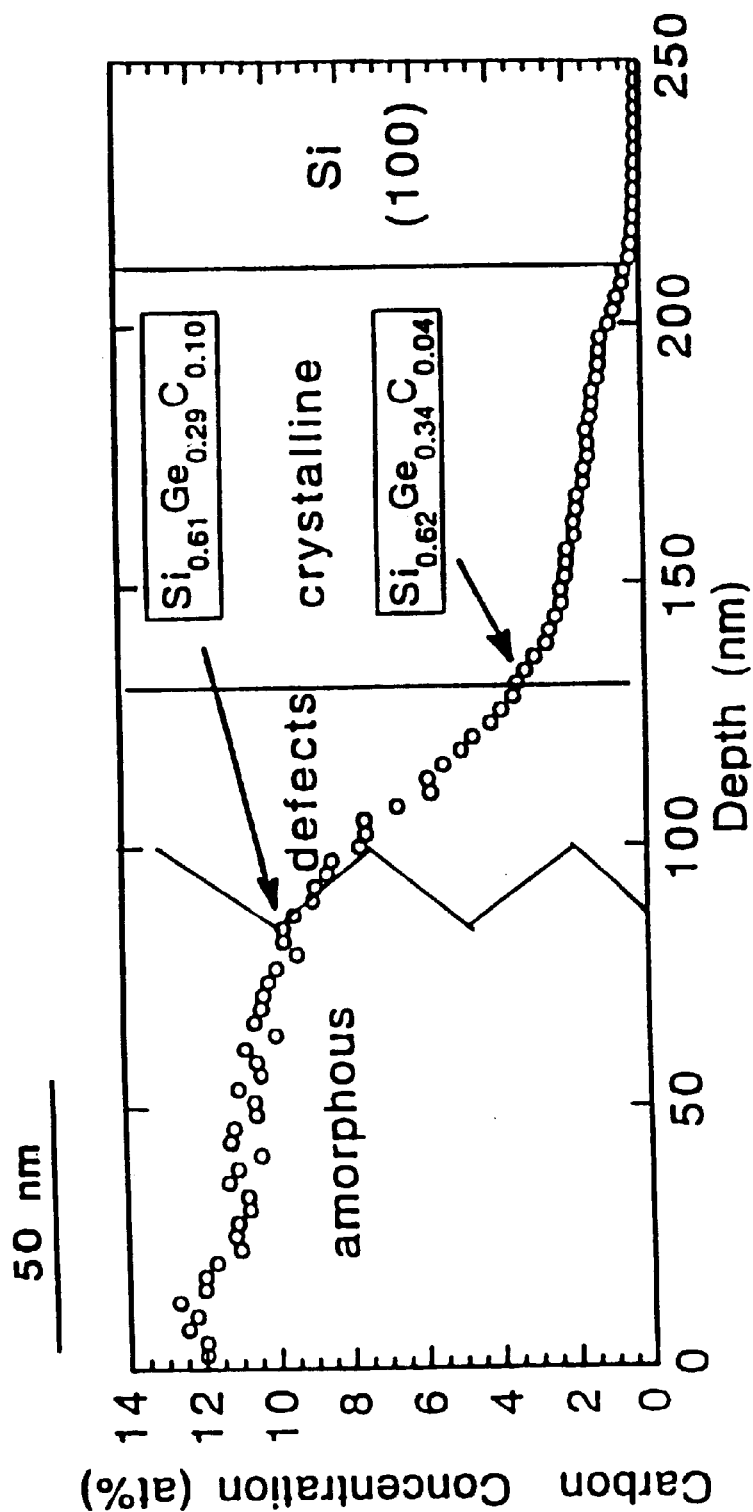
FIG. 15 illustrates cross-sectional TEM micrograph and corresponding calibrated carbon SIMS profile of sample D-6. The Si—Ge—C can be roughly divided into three regions: crystalline, highly defective, and amorphous region.

A cross-sectional TEM micrograph and calibrated carbon SIMS profile of sample D-6, shown in FIG. 15, corroborate the RBS results. Based on these results, the Si—Ge—C layer can be roughly divided into three regions. Immediately adjacent to the Si—Ge—C/Si interface there is a crystalline region, ~90 nm thick, with a roughly linear increase in carbon concentration up to ~4 atomic %. The next region, 30–40 nm thick, is highly defective and contains many lattice defects such as stacking faults and twins. The carbon concentration in this region increases sharply from 4 to ~10 atomic %. Careful analysis of lattice-fringes in this region using optical diffraction methods reveals no unexpected spacings, indicating in particular that no silicon carbide has been formed. The third region near the surface is completely amorphous, ~80 nm thick, and the carbon concentration is ~10–12 atomic %.

The concentration of the alloy obtained at the crystalline/defective region interface is $Si_{0.62}Ge_{0.34}C_{0.04}$ (shown in FIG. 4), which is probably the highest C content that can be achieved without defects in the crystalline layer under these CVD conditions. The Ge:C ratio at this point is 8.5:1, which is very close to the fully strain-compensated value (8.2:1) that was calculated using Vegard's law. See S. S. Iyer, K. Eberl, M. S. Goorsky, F. K. LeGoues, J. C. Tsang, Appl. Phys. Lett. 60, 356 (1992), which is incorporated by reference in its entirety. This Ge:C ratio decreases dramatically in the defective region to a minimum value of 2.9:1 at the defective region/amorphous interface. There appears to be some correlation between the relative Ge:C composition and the occurrence of lattice defects, suggesting that tensile strain could play a role in their production. However, this interpretation may be too simple-minded, since the strain around the individual C atoms will be much greater than around Ge atoms.

In spite of the fact that the $C_2H_4$ flow was increased linearly during growth, the carbon profile, as depicted by SIMS analysis, has a sigmoidal shape. This result indicates that carbon atoms can be incorporated into the Si—Ge matrix of the grown layer much more easily when it is in an amorphous state, i.e., the $C_2H_4$ precursor is more reactive when it comes into contact with an amorphous substrate relative to a crystalline one. The $GeH_4$ precursor behaves in the opposite manner, since the Ge concentration decreases during growth. The reactivity of the $SiH_2Cl_2$ precursor, however, did not change.

In summary, CVD of $Si_{1-x-y}Ge_xC_y$ alloy layers on (100)Si substrates is reported. Alloy layers with up to 2 atomic % of carbon have been grown epitaxially, and have good crystallinity. Above a critical level of $C_2H_4$ flow, when the Ge:C ratio of the deposited layer is higher than 8.5:1, the grown layer becomes increasingly defective, and when Ge:C<~3:1, an amorphous layer is eventually formed.

This work was supported by AFOSR (DARPA) Award F49620-93-C-0018. Electron microscopy was conducted at the Center for High Resolution Electron Microscopy supported by the National Science Foundation under Grant DMR-9115680.

Figure 2B:
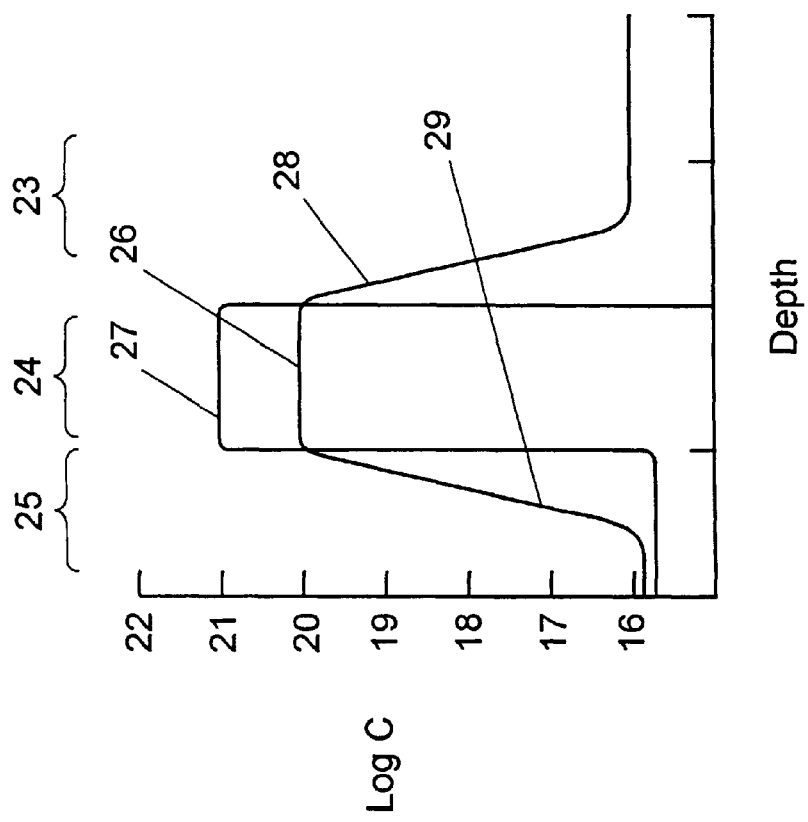
FIGS. 2A–B are graphs illustrating the dopant diffusion tail that is common with conventional etch-stop layers.
Figure 2A:
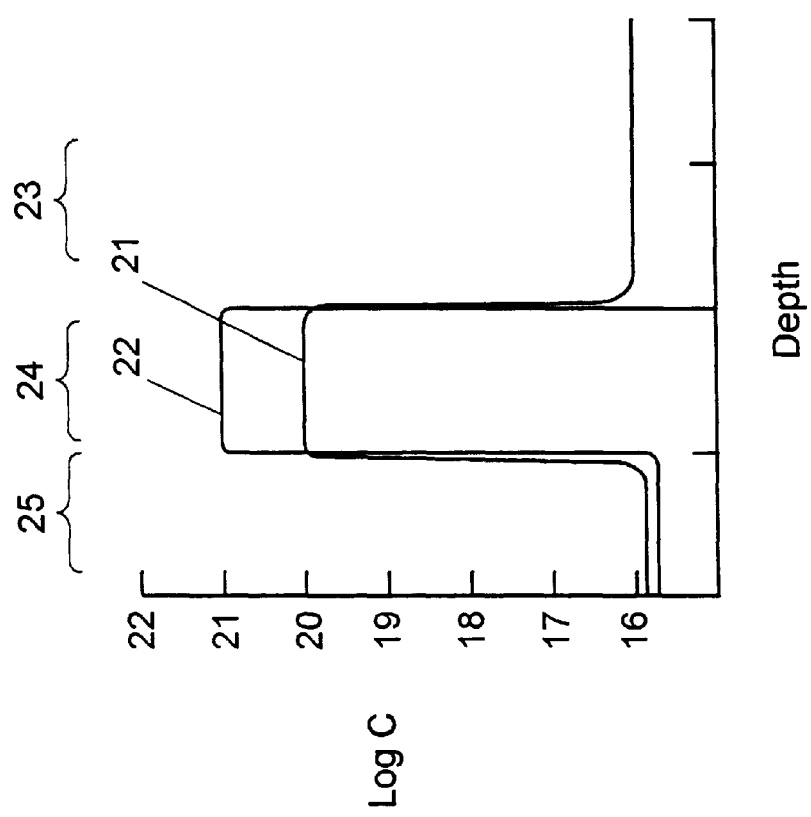
Figure 6B:
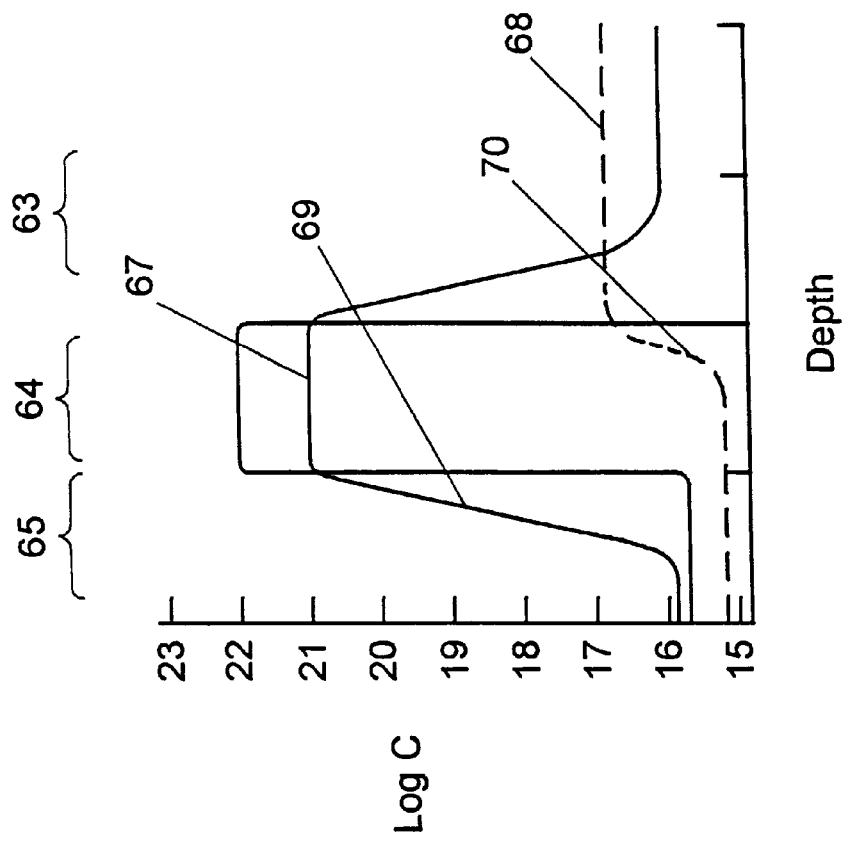
FIGS. 6A–B are graphs illustrating the absence of an electrically active dopant tail with a Si—Ge—C etch-stop layer.
Figure 6A:
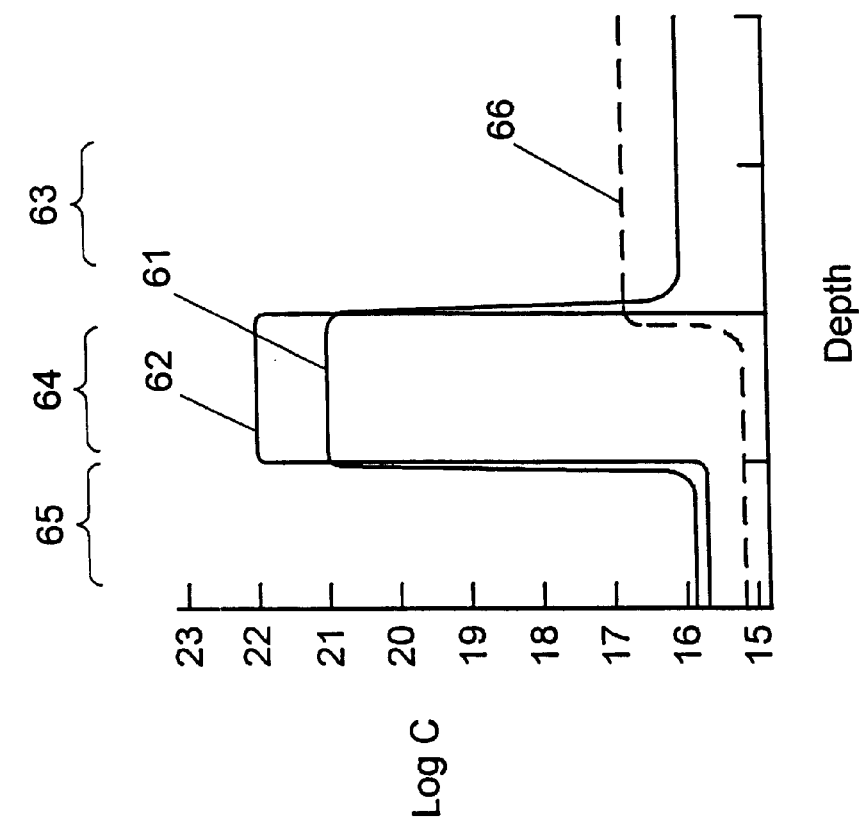

Advantages of Si—Ge—C being isoelectronic:

An additional advantage of the Si—Ge—C etch-stop over the most commonly used Si—Ge—B etch-stop is that all three components of the Si—Ge—C alloy are isoelectronic, i.e., none supplies an electrically active dopant. Thus, if there is slight diffusion of one of the elements into the silicon device layer, the electrically active dopant concentration will not be affected. Further, since germanium and carbon affect the band structure and band gap of silicon, it will be advantageous for some applications to leave the Si—Ge—C etch-stop layer in place to become part of the device structure. FIGS. 6A–B illustrate the point. FIG. 6A illustrates carbon (61) and germanium (62) concentration profiles over a substrate (63), on which an epitaxial Si—Ge—C etch-stop layer (64) and a lightly doped device layer (65) have been epitaxially grown before a bonding anneal. This structure represents the starting point for a BESOI process, which can be compared to the Si—Ge—B structure shown in FIGS. 2A–B. In FIG. 6A, the boron concentration (66) is deliberately low throughout the concentration profile. The substrate (63) is shown with a boron concentration of about 1E17 atoms per $cm^3$, and the epitaxial layers (64, 65) are grown with a boron concentration of about 2E15 atoms per $cm^3$. FIG. 6B shows the concentration profiles after the bonding anneal. The carbon (67) and boron (68) profiles broaden during the anneal due to diffusion. In contrast to the Si—Ge—B etch-stop in FIG. 2B, the carbon (69) in the device layer (65) of FIG. 6B does not contribute electrical carriers and the substrate boron diffusion tail (70), residing in the etch-stop layer (64), does not contribute electrical carriers to the device layer (65).

Figure 7A:
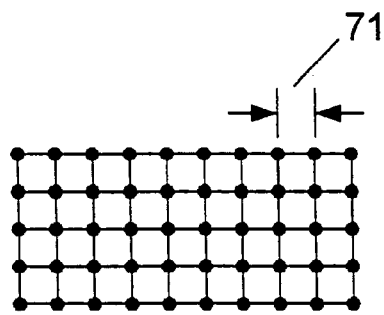
FIGS. 7A–F are ball-and-stick representations of crystal structure illustrating the effect of carbon and germanium atoms on stress in silicon alloys.
Figure 7D:
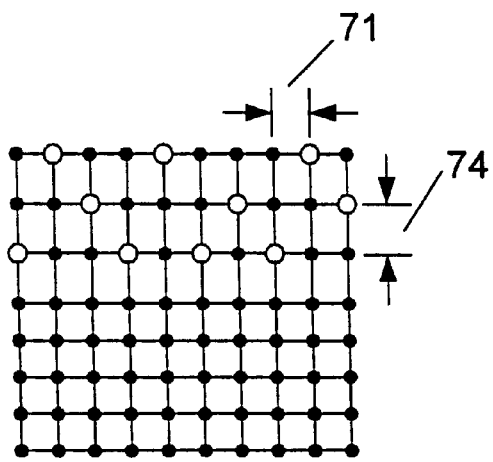
Figure 7B:
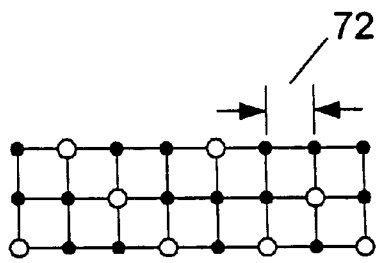
Figure 7E:
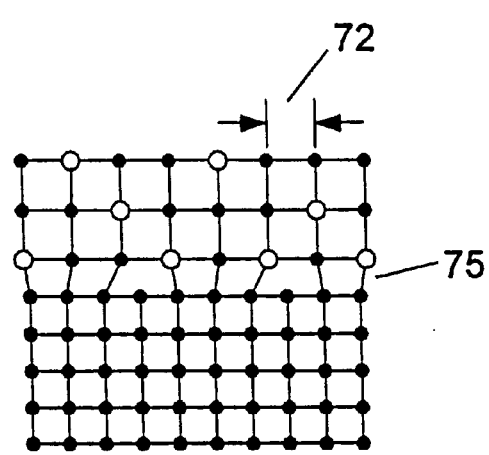
Figure 7C:
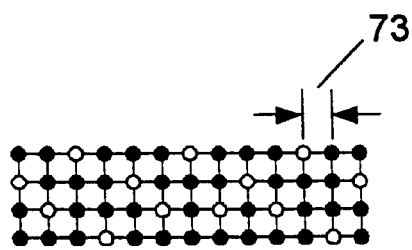
Figure 7F:
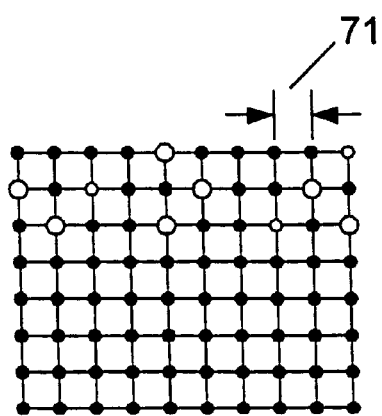

Advantages of Si—Ge—C permitting strain control:

The present invention also permits strain control in the Si—Ge—C layer. Germanium and carbon atoms both differ in size from silicon. The fourfold covalent atomic radius of germanium is about 5% larger than silicon, whereas carbon is about 50% smaller. The effects of germanium and carbon addition to silicon are shown schematically in FIGS. 7A–F. In undoped silicon, there is naturally-occurring spacing (71) between the silicon atoms, represented as solid dots in FIG. 7A. When germanium atoms are added to silicon, the lattice parameter or atomic spacing (72) in the crystalline structure is increased by the larger germanium atoms represented by the large white dots in FIG. 7B. By contrast, when carbon atoms represented by the small grey dots are added to silicon, the atomic spacing (73) is decreased as shown in FIG. 7C. As shown in FIG. 7D, when a Si—Ge epitaxial layer represented by the upper three rows of solid and white dots is grown onto a silicon substrate represented by the lower five rows of solid dots, a compressive in-plane stress arises as the Si—Ge layer is forced to assume the atomic spacing (71) of the unstrained silicon substrate. The Si—Ge lattice expands in a direction normal to the silicon substrate to form spacing (74) causing a tensile strain in that direction. Conversely, when a Si—C layer is grown epitaxially onto a silicon substrate, the Si—C layer is under an in-plane tensile strain and a compressive strain in the direction normal to the silicon substrate. Thus, when either a Si—Ge or a Si—C layer is grown epitaxially onto silicon, the growing layer experiences a stress that increases with the thickness of the layer and with the concentration of Ge or C. At some critical thickness the stress exceeds the yield stress, the point at which dislocations nucleate at the epitaxial layer-substrate interface and propagate to form a two-dimensional defect array (75) as illustrated in FIG. 7E for the case of Si—Ge. This array of misfit dislocations allows the epitaxial layer to assume its unstrained atomic spacing (72), and in doing so relieves the stress in the epitaxial layer. If, however, the epitaxial layer includes Ge and C in a ratio defined by: (atomic radius Si-atomic radius C)/(atomic radius Ge-atomic radius Si), about 9:1 Ge:C, the epitaxial layer will have similar atomic spacing (71) to undoped silicon and be free of stress as shown in FIG. 7F. In this case, the epitaxial layer-substrate interface remains free of misfit dislocations.

In different applications, it will be advantageous to grow Si—Ge—C layers that (1) are strain-free, or (2) have strain that is grown-in to a pre-defined level, or (3) have lattice parameter misfit at so high a level as to cause misfit dislocations to form. Fabrication of a cantilever beam in an accelerometer application is an example in which the layer should be grown stress-free so that the beam will not be bowed. On the other hand, when a Si—Ge—C layer is to be made into a membrane, a slightly tensile stress, created by increasing the carbon-to-germanium ratio, is desirable so that the membrane will be smooth and "tight." For semiconductor devices, both strain and composition are means by which the band gap and band structure can be varied for particular applications. At the same time, it is usually important for electronic applications that the epitaxial layers, whether strained or unstrained, must be free of defects including misfit dislocations. For some mechanical applications, on the other hand, it may be desirable to create an array of misfit dislocations. Such dislocations can strengthen the silicon by a process known as "work hardening."

The above-referenced interface misfit stress can be measured in any of several ways. One is to measure the interatomic spacing of a Si—Ge—C layer grown epitaxially onto a silicon substrate, in the direction perpendicular to the substrate surface, by precision X-ray diffraction. As long as the critical stress for formation of misfit dislocations has not been exceeded, the difference in lattice parameter between the epitaxial layer and the substrate is proportional to the stress in the grown layer. Another method is to measure the bow of a silicon substrate before and after depositing the epitaxial Si—Ge—C layer. The change in bow is related by a simple formula to the stress in the Si—Ge—C layer. P. Singer, "Film Stress and How to Measure It", *Semiconductor International,* October 1992, p. 58, which is incorporated by reference in its entirety.

Figure 8:
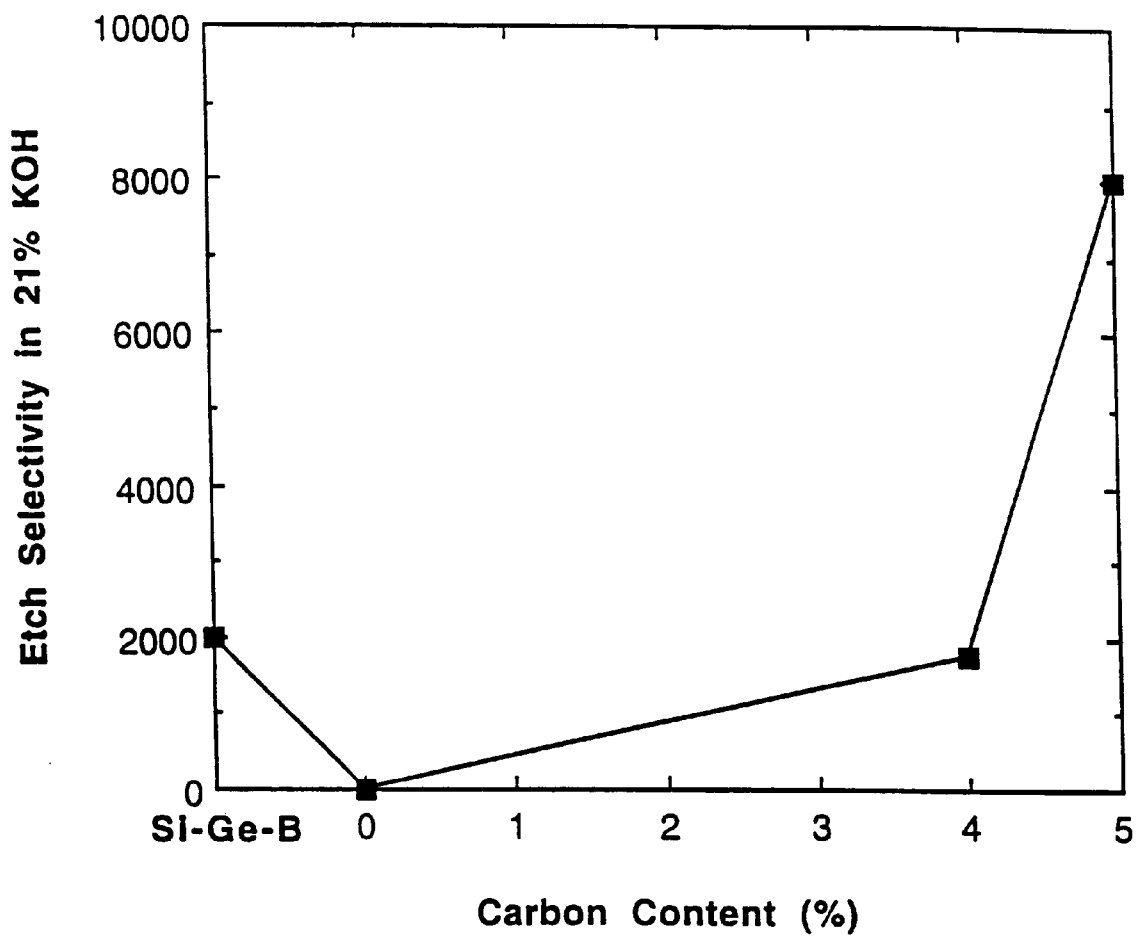
FIG. 8 is a graph illustrating the superior etch selectivity of Si—Ge—C in KOH-$H_2O$ compared with Si—Ge—B.
Figure 9:
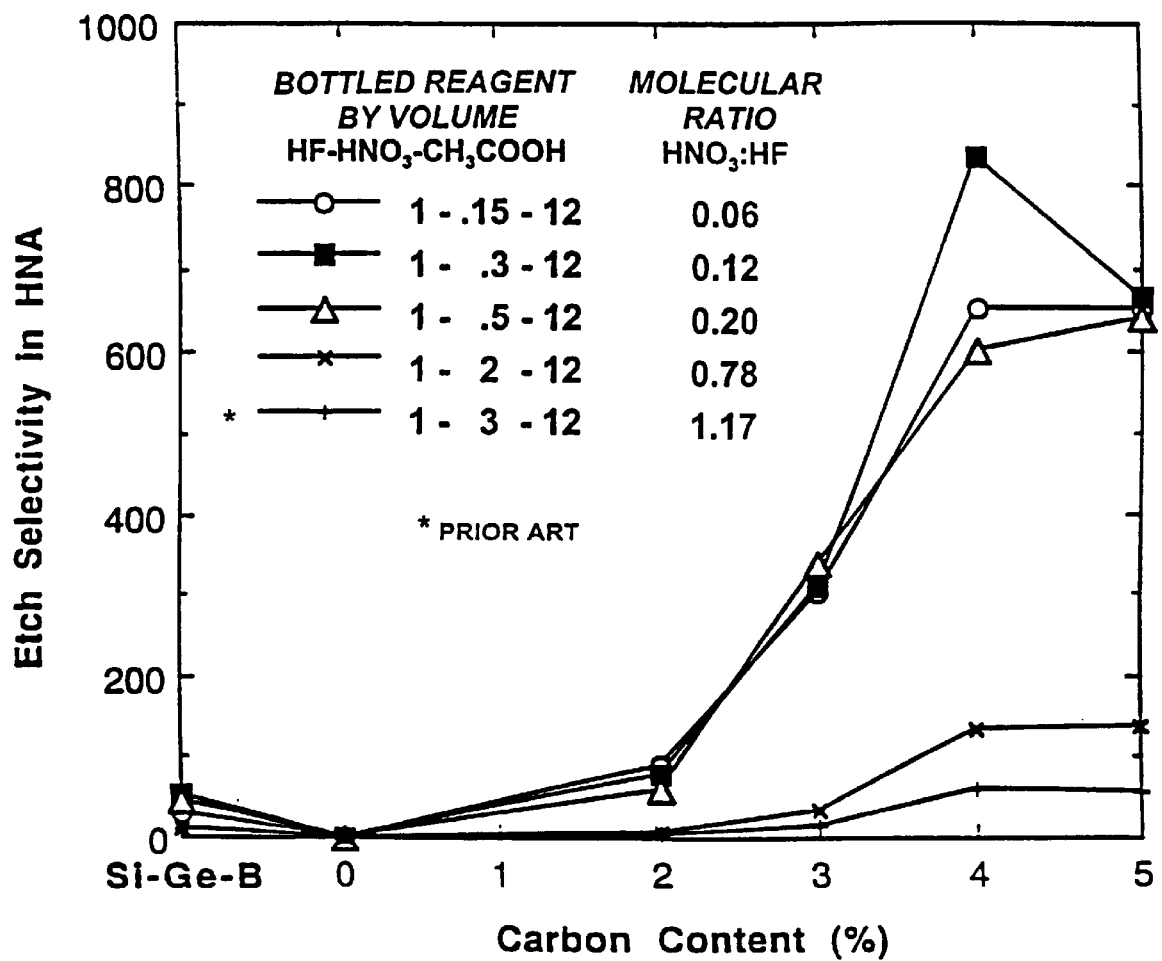
FIG. 9 is a graph illustrating the superior etch selectivity of Si—Ge—C in HNA compared with Si—Ge—B.

Advantages of Si—Ge—C having high etch selectivity:

As FIGS. 8 and 9 illustrate, the etch selectivity of the Si—Ge—C epitaxial layer is much higher than that of Si—Ge—B in both KOH-$H_2O$ and HNA etch solutions. In FIG. 8, the etch selectivity of Si—Ge—C in 21 wt % KOH-$H_2O$ is plotted against carbon content in the epitaxial layer, with the etch selectivity of a Si—Ge—B layer having 1E21 atoms per $cm^3$ of Ge and 2E20 atoms per $cm^3$ of B shown on the left side of FIGS. 8 and 9 for comparison. The germanium content of the carbon-containing etch-stop layers increases approximately in proportion to the carbon content to compensate strain, in atomic percent as follows:

| Carbon | Germanium | Silicon |
|--------|-----------|---------|
| 2%     | 18%       | 80%     |
| 3%     | 27%       | 70%     |
| 4%     | 36%       | 60%     |
| 5%     | 42%       | 53%     |

Here, etch selectivity in KOH-$H_2O$ is defined as the etch rate of lightly doped silicon divided by the etch rate of the etch-stop layer. FIG. 8 is a graph of the selectivity of Si—Ge—C and Si—Ge—B etch stops with respect to lightly doped silicon. A selectivity of 8000:1 in 21 wt % KOH-$H_2O$ at 70° C. has been measured by employing black wax to mask the etch-stop layer before exposing to the etchant, measuring the resultant step in the etch-stop layer and comparing that distance against the etch depth in lightly doped silicon under the same etchant. However, it is believed that by employing a silicon nitride mask, the selectivity of the $Si_{0.53}Ge_{0.42}C_{0.05}$ etch-stop will be even higher. In any event, the selectivity of the Si—Ge—C etch-stop is apparently higher than that of $SiO_2$ and is a significant improvement over Si—Ge—B, which shows a maximum selectivity of 2000:1 under the same conditions.

FIG. 9 compares the etch selectivity of Si—Ge—B and Si—Ge—C as a function of carbon concentration in five HNA solutions. For etch-stop removal in HNA, etch selectivity is defined as the etch rate of the etch-stop layer divided by the etch rate of lightly doped silicon. FIG. 9 illustrates that in HNA solution, the selectivity of the etch-stop layer is enhanced by two innovations. The five HNA solutions are prepared from standard aqueous reagents which are as follows: 49 wt % HF, 70 wt % $HNO_3$, and 99 wt % $CH_3OOH$. First, we discovered that selectivity increases with carbon content, reaching a maximum selectivity at about 4 atomic percent carbon. Second, we discovered that selectivity increases as the $HNO_3$ content of the HNA solution decreases, reaching maximum selectivity of more than 800:1 with the $HF:HNO_3:CH_3COOH$ volume ratio of 1:0.3:12 and 4 atomic percent carbon. A further benefit of reducing the $HNO_3$ concentration in the HNA solution is that the solution is stable against the chemical reduction of $HNO_3$ to $HNO_2$, a problem that plagues users of the conventional 1:3:8 and 1:3:12 HNA compositions. It is an important advantage that our etch solutions remain colorless and etch selectivity is independent of time for etch times of 30 minutes or more (1:3:8 and 1:3:12 HNA solutions turn yellow and lose selectivity rapidly over the first few minutes of use). We discovered the novel HNA formulations also will increase the etch selectivity of Si—Ge—B as the $HNO_3$ concentration of the solution is decreased reaching a maximum of 50.

The unique properties of the Si—Ge—C etch-stop layers combined with the new HNA etch compositions are suggested by the behavior of the Si—Ge—C surface in the etch solution. The etch solution is believed to work by simultaneously oxidizing the surface (performed by the $HNO_3$) and etching the oxide (performed by the HF). Si—Ge—C surfaces are hydrophilic when they emerge from the HNA solutions for all etch compositions from 1:3:12 to 1:0.1:12, in contrast to lightly doped Si with hydrophobic surfaces, indicating that the oxide removal performed by HF dominates the etching rate of Si—Ge—C layers.

Favorable results are believed to be obtained for etch selectivity in HNA when the silicon is in the range of 50 to 90 atomic percent, the germanium is in the range of 9 to 50 atomic percent, and the carbon is in the range of 1 to 10 atomic percent, preferably in the range of 3 to 6 atomic percent. More preferably, the Si—Ge—C is in the range for Si, Ge and C of 50–60 atomic percent, 36–45 atomic percent, and 4–5 atomic percent, respectively.

We believe that the some of useful ranges of Si—Ge—C compositions are: silicon in a range of 0 to 99.9 atomic percent, preferred 45 to 83 atomic percent, further preferred about 55.5 atomic percent, germanium in a range of 1 to 92 atomic percent, preferred 15 to 50 atomic percent, and further preferred about 40 atomic percent, and carbon in the range of 0.1 to 10 atomic percent, preferred 2 to 6 atomic percent, and further preferred about 4.5 atomic percent.

Examples: Si—Ge—C Etch-Stop in Nanotechnology Applications

A. Membrane

Figure 10A:
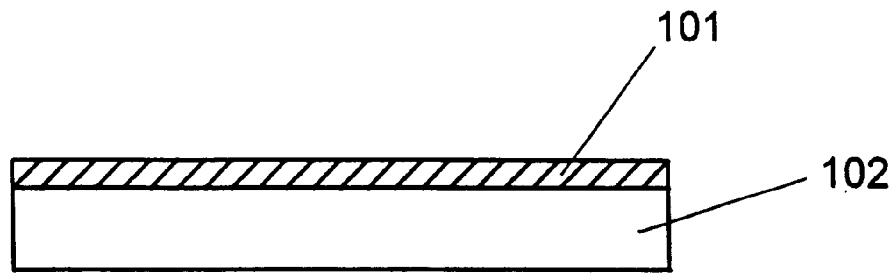
FIGS. 10A–C are cross-sections illustrating a process for making a membrane using an etch-stop layer.
Figure 10B:
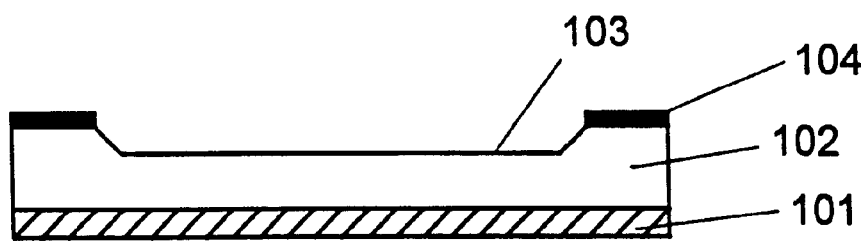
Figure 10C:
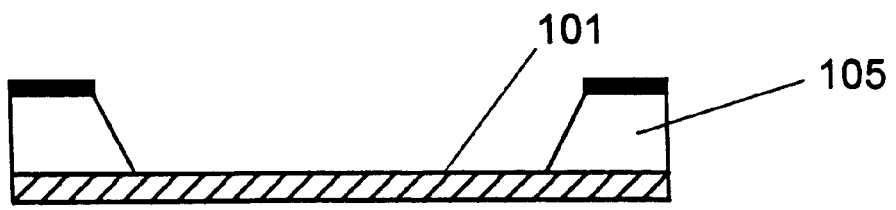

One example of silicon membrane fabrication is illustrated in FIGS. 10A–C. As shown in FIG. 10A, Si—Ge—C layer (101) is epitaxially grown onto a lightly doped, conventional polished silicon substrate (102). Favorable results can be achieved by using the processes described earlier in the section on epitaxial growth of Si—Ge—C layers by CVD on silicon. The silicon substrate (102) and Si—Ge—C layer (101) form a structure which is inverted as shown in FIG. 10B and an oxide layer (104) is formed on the back side of the silicon substrate (102). A positive photoresist (not shown) is applied to the oxide layer (104), and then exposed through openings in the mask. The exposed and developed photoresist is removed and then the underlying exposed oxide layer is removed with a conventional HF solution. The exposed portion of the back side of the silicon substrate (102) is etched by a 21 wt % KOH-$H_2$O etchant that rapidly removes the lightly doped silicon substrate (102) as indicated by surface (103) formed during an intermediate stage of the etch, but then etches at a slower rate when it reaches the Si—Ge—C (101) as shown in FIG. 10C. As shown in FIG. 10C, when the etching is complete, the Si—Ge—C layer (101) remains as a membrane supported by a silicon substrate frame (105) defined by the remaining portions of the silicon substrate (102). The carbon-to-germanium ratio in the etch-stop layer is adjusted so that the Si—Ge—C membrane (101) is preferably in tension. This ensures that the membrane (101) is "tight" and well supported by the frame (105).

B. Cantilever Beam

Figure 11A:
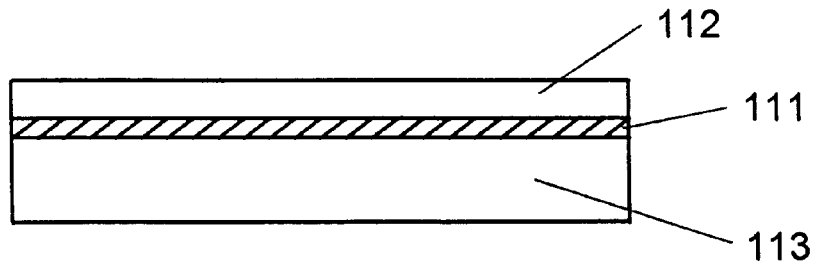
FIGS. 11A–C are cross-sections illustrating a process for making a cantilever beam using an etch-stop layer.
Figure 11B:
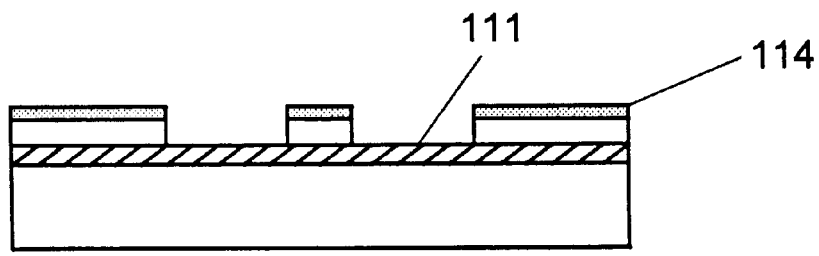
Figure 11C:
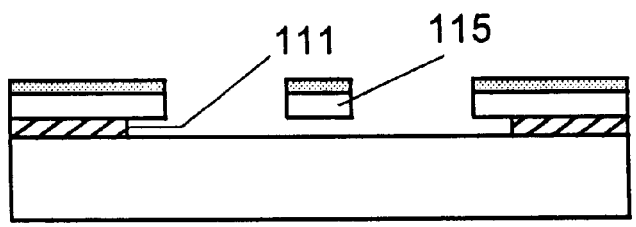
Figure 11D:
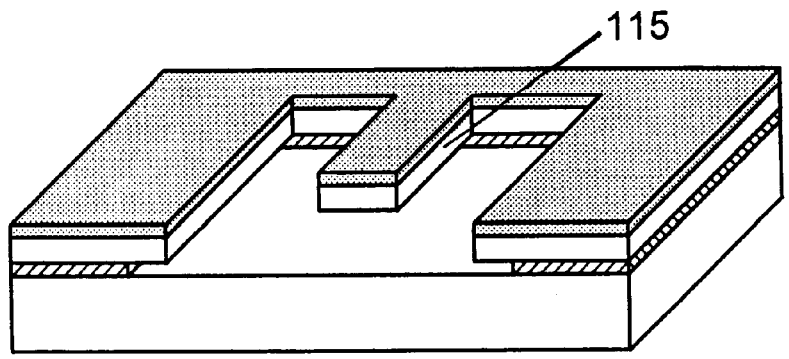
FIG. 11D is a perspective view illustrating the cantilever beam formed using the process of FIGS. 11A–C.

Another example of a micromechanical application of a Si—Ge—C epitaxial etch-stop layer is in fabricating a cantilever beam as illustrated in FIGS. 11A–C. In FIG. 11A, a Si—Ge—C etch-stop layer (111) and a lightly doped silicon layer (112) are grown onto a silicon substrate (113). A masking oxide (114) shown in FIG. 11B is grown and patterned using a technique like that used in the membrane fabrication, and the exposed portion of the lightly doped silicon (112) is etched by a 21 wt % KOH-$H_2$O etchant that rapidly removes the lightly doped silicon but etches very slowly when it reaches the Si—Ge—C layer (111). Next, the Si—Ge—C layer (111) is etched by HNA that rapidly removes the exposed Si—Ge—C layer (111) as shown in FIG. 11C, but only etches lightly doped silicon very slowly. In this way, the cantilever beam (115) formed from the lightly doped silicon layer (112) is freed from the surrounding silicon substrate. FIG. 11D is a perspective drawing showing the finished cantilever beam (115) attached to the rest of the lightly doped silicon layer (112) at one end. Other precision micro-miniature structures can be fabricated using processes like this.

It will be appreciated by those of ordinary skill in the art that many variations in the foregoing embodiments are possible while remaining within the scope of the present invention. Thus, the invention has applications well beyond those enumerated. The present invention should thus not be considered limited to the preferred embodiments.

What is claimed is:

1. A wet chemical etchant, comprising:

3.5–15.8 mole percent of HF;
 0.2–9.7 mole percent of $HNO_3$;
 34.8–82.6 mole percent of $CH_3COOH$;
 12.3–46.5 mole percent of $H_2O$; and
 wherein the molecular ratio of $HNO_3$ to HF is less than about 0.78.

2. A wet chemical etchant, comprising:

6.2–8.2 mole percent of HF;
 0.3–6.9 mole percent of $HNO_3$;
 53.8–71.1 mole percent of $CH_3COOH$;
 20.4–33.1 mole percent of $H_2O$; and
 wherein the molecular ratio of $HNO_3$ to HF is less than about 0.78.

3. The wet chemical etchant of claim 1, wherein the molecular ratio of $HNO_3$ to HF is less than 0.78.

4. The wet chemical etchant of claim 1, wherein the molecular ratio of $HNO_3$ to HF is less than about 0.20.

5. The wet chemical etchant of claim 2, wherein the molecular ratio of $HNO_3$ to HF is less than 0.78.

6. The wet chemical etchant of claim 2, wherein the molecular ratio of $HNO_3$ to HF is less than about 0.20.

7. The wet chemical etchant of claim 1, wherein components are limited as follows:

7.3–9.5 mole percent of HF;
 0.3–8.6 mole percent of $HNO_3$;
 62.9–79.0 mole percent of $CH_3COOH$; and
 11.2–21.3 mole percent of $H_2O$.

* * * * *